(12) United States Patent
Saruki et al.

(10) Patent No.: US 12,320,872 B2
(45) Date of Patent: *Jun. 3, 2025

(54) MAGNETIC SENSOR AND MAGNETIC SENSOR SYSTEM

(71) Applicant: TDK CORPORATION, Tokyo (JP)

(72) Inventors: Shunji Saruki, Tokyo (JP); Hiraku Hirabayashi, Tokyo (JP); Masanori Sakai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 36 days.

This patent is subject to a terminal disclaimer.

(21) Appl. No.: 18/223,135

(22) Filed: Jul. 18, 2023

(65) Prior Publication Data

US 2023/0358828 A1 Nov. 9, 2023

Related U.S. Application Data

(63) Continuation of application No. 17/836,016, filed on Jun. 9, 2022, now Pat. No. 11,754,647, which is a (Continued)

(30) Foreign Application Priority Data

Jun. 5, 2019 (JP) ................. 2019-105074

(51) Int. Cl.
  *G01R 33/09* (2006.01)
  *G01R 33/00* (2006.01)

(52) U.S. Cl.
  CPC ....... *G01R 33/098* (2013.01); *G01R 33/0017* (2013.01); *G01R 33/093* (2013.01); *G01R 33/096* (2013.01)

(58) Field of Classification Search
  CPC .............. G01R 33/098; G01R 33/0017; G01R 33/093; G01R 33/096; G01R 33/091; G01R 33/0005
  See application file for complete search history.

(56) References Cited

U.S. PATENT DOCUMENTS 7,126,330 B2 10/2006 Peczalski et al.
7,492,554 B2 2/2009 Breuer et al.
(Continued)

FOREIGN PATENT DOCUMENTS

JP S55-154408 U 11/1980
JP H01-250875 A 10/1989
(Continued)

OTHER PUBLICATIONS

Jul. 18, 2024 Office Action issued in U.S. Appl. No. 18/404,023.
(Continued)

*Primary Examiner* — Feba Pothen
(74) *Attorney, Agent, or Firm* — Oliff PLC

(57) ABSTRACT

At a reference position within a first plane, a magnetic field to be detected has a first direction that changes within the first plane. A magnetic sensor includes an MR element. The MR element includes a magnetic layer having first magnetization that can change in direction within a second plane. The first plane and the second plane intersect at a dihedral angle α other than 90°. The magnetic field to be detected can be divided into an in-plane component parallel to the second plane and a perpendicular component perpendicular to the second plane. The in-plane component has a second direction that changes with a change in the first direction. The direction of the first magnetization changes with a change in the second direction. A detection value depends on the direction of the first magnetization.

12 Claims, 18 Drawing Sheets

Related U.S. Application Data continuation of application No. 16/878,008, filed on May 19, 2020, now Pat. No. 11,391,795.

(56) References Cited

U.S. PATENT DOCUMENTS

| | | |
|---|---|---|
| 8,110,119 B2 | 2/2012 | Breuer et al. |
| 2006/0176142 A1 | 8/2006 | Naito et al. |
| 2007/0194787 A1 | 8/2007 | Takahashi et al. |
| 2008/0169807 A1 | 7/2008 | Naito et al. |
| 2010/0327864 A1* | 12/2010 | Vigna .................... B82Y 25/00 |
| | | 324/252 |
| 2012/0038348 A1 | 2/2012 | Aimuta et al. |
| 2014/0138782 A1 | 5/2014 | Chien |
| 2014/0299950 A1 | 10/2014 | Kim et al. |
| 2015/0192432 A1 | 7/2015 | Noguchi et al. |
| 2015/0369882 A1 | 12/2015 | Mochizuki |
| 2017/0261342 A1 | 9/2017 | Nagata et al. |
| 2018/0275218 A1 | 9/2018 | Umetsu |
| 2018/0275219 A1* | 9/2018 | Umetsu ................ G01R 33/093 |
| 2018/0356473 A1 | 12/2018 | Hirota et al. |

FOREIGN PATENT DOCUMENTS

| | | |
|---|---|---|
| JP | 109-219546 A | 8/1997 |
| JP | 2004-006752 A | 1/2004 |
| JP | 2005-116828 A | 4/2005 |
| JP | 2006-208020 A | 8/2006 |
| JP | 2008-281556 A | 11/2008 |
| JP | 2008-286739 A | 11/2008 |
| JP | 2012-208063 A | 10/2012 |
| JP | 2018-205241 A | 12/2018 |

OTHER PUBLICATIONS

Translation of Jun. 1, 2021 Office Action issued in Japanese Patent Application No. 2019-105075.
Aug. 20, 2021 Election of Species Requirement issued in U.S. Appl. No. 16/877,579.
Jun. 21, 2021 U.S. Office Action issued U.S. Appl. No. 16/887,459.
Translation of Jun. 1, 2021 Office Action issued in Japanese Patent Application No. 2019-108115.
Sep. 9, 2021, Notice of Allowance Issued in U.S. Appl. No. 16/887,459.
Translation of May 11, 2021 Office Action issued in Japanese Patent Application No. 2019-105074.
Dec. 22, 2021 Notice Of Allowance issued in U.S. Appl. No. 16/887,459.
May 11, 2021 Office Action issued in Japanese Patent Application No. 2019-105074.
Jan. 24, 2022 Office Action issued in U.S. Appl. No. 16/877,579.
Jun. 26, 2023 Office Action issued in U.S. Appl. No. 17/865,839.

* cited by examiner

MAGNETIC SENSOR AND MAGNETIC SENSOR SYSTEM

CROSS REFERENCE TO RELATED APPLICATION

This application is a continuation of U.S. application Ser. No. 17/836,016, filed Jun. 9, 2022, which is a continuation of U.S. application Ser. No. 16/878,008, filed May 19, 2020, the contents of which are incorporated herein by reference.

BACKGROUND OF THE INVENTION

1. Field of the Invention

The present invention relates to a magnetic sensor, and a magnetic sensor system including the magnetic sensor.

2. Description of the Related Art

Magnetic sensors have been used for a variety of applications. Examples of known magnetic sensors include one that uses a spin-valve magnetoresistive element provided on a substrate. The spin-valve magnetoresistive element includes a magnetization pinned layer having a magnetization whose direction is fixed, a free layer having a magnetization whose direction is variable depending on the direction of an applied magnetic field, and a gap layer located between the magnetization pinned layer and the free layer. In many cases, the spin-valve magnetoresistive element provided on a substrate is configured to have sensitivity to a magnetic field in a direction parallel to the surface of the substrate. Such a magnetoresistive element is thus suitable to detect a magnetic field that changes in direction within a plane parallel to the substrate surface.

On the other hand, a system including a magnetic sensor may be intended to detect a magnetic field containing a component in a direction perpendicular to the surface of a substrate by using a magnetoresistive element provided on the substrate. An example of such a system is described in US 2015/0192432 A1, JP H09-219546 A, US 2008/0169807 A1, and US 2018/0275218 A1.

US 2015/0192432 A1 describes a magnetic sensor for detecting the position of a magnet. This magnetic sensor includes a substrate, two magnetic sensor elements located on the substrate, a magnet located above the substrate, and a soft magnetic body. The soft magnetic body is located between the magnet and the two magnetic sensor elements. The soft magnetic body converts a magnetic field on an XZ plane, generated by the magnet, into a magnetic field on an XY plane to which the two magnetic sensor elements have sensitivity. The XY plane is parallel to the substrate surface. The XZ plane is perpendicular to the substrate surface.

JP H09-219546 A describes an apparatus in which a magnetoresistive element including magnetic stripes is located on a slope formed on a substrate, and a rotating body including a magnet is located above the substrate. In this apparatus, as the rotating body rotates, the direction of a magnetic field generated by the rotating body changes within a plane of variation perpendicular to the slope. The magnetoresistive element detects the magnetic field generated by the rotating body.

US 2008/0169807 A1 and US 2018/0275218 A1 describe an apparatus including three sensors for detecting an X-direction component, a Y-direction component, and a Z-direction component of an external magnetic field. In this apparatus, the sensor for detecting the Z-direction component includes a magnetoresistive element located on a slope formed on a substrate.

The magnetic sensor described in US 2015/0192432 A1 has a problem that the detection accuracy can drop due to an unnecessary magnetic field occurring from the soft magnetic body and the magnetic hysteresis characteristics of the soft magnetic body.

Next, a problem with the apparatuses described in JP H09-219546 A, US 2008/0169807 A1, and US 2018/0275218 A1 will be described. The sensor for detecting the Z-direction component in US 2008/0169807 A1 and US 2018/0275218 A1 will hereinafter be referred to as a Z-direction sensor. The magnetic field applied to the magnetoresistive element in JP H09-219546 A and the magnetic field applied to the Z-direction sensor in US 2008/0169807 A1 and US 2018/0275218 A1 will each be referred to as an applied magnetic field. The component of the applied magnetic field to which the magnetoresistive element according to JP H09-219546 A has sensitivity and the component of the applied magnetic field to which the Z-direction sensor according to US 2008/0169807 A1 and US 2018/0275218 A1 has sensitivity will each be referred to as a sensitivity component.

The strength of the applied magnetic field can vary due to reasons such as variations in the arrangement of the constituent parts of the apparatus. The apparatuses described in JP H09-219546 A, US 2008/0169807 A1, and US 2018/0275218 A1 have a problem that the detection accuracy drops greatly relative to variations in the strength of the applied magnetic field. A detailed description thereof is given below.

The lower the strength of the sensitivity component, the greater the degree of drop in the detection accuracy relative to variations in the strength of the applied magnetic field. In the apparatus described in JP H09-219546 A, the direction of the applied magnetic field changes within the plane of variation of the magnetic field perpendicular to the slope. In the apparatus, the direction of the applied magnetic field can thus be perpendicular to the slope, i.e., direction to which the magnetoresistive element has no sensitivity. In such an apparatus, the strength of the sensitivity component can be zero.

In the apparatuses described in US 2008/0169807 A1 and US 2018/0275218 A1, the direction of the applied magnetic field can be perpendicular to the slope, i.e., direction to which the Z-direction sensor has no sensitivity. In such an apparatus, the strength of the sensitivity component can be zero.

In the apparatuses described in JP H09-219546 A, US 2008/0169807 A1, and US 2018/0275218 A1, the detection accuracy can drop greatly relative to variations in the strength of the applied magnetic field if the direction of the applied magnetic field is such that the strength of the sensitivity component has a value of zero or near zero in particular.

SUMMARY OF THE INVENTION

An object of the present invention is to provide a magnetic sensor that can generate a detection value corresponding to the direction of a magnetic field to be detected that changes in direction within a variable range including a direction outside a predetermined plane by using a magnetoresistive element suitable to detect a magnetic field that changes in direction within the predetermined plane while suppressing a drop in detection accuracy, and a magnetic sensor system including the magnetic sensor.

A magnetic sensor according to the present invention detects a magnetic field to be detected and generates a detection value. The magnetic field to be detected has a first direction at a reference position within a first plane, and the first direction changes within a predetermined variable range in the first plane. The magnetic sensor according to the present invention includes at least one magnetoresistive element. The at least one magnetoresistive element each includes a first magnetic layer having first magnetization that can change in direction within a corresponding second plane. The first plane and the second plane intersect at a dihedral angle other than 90°.

The magnetic field to be detected received by each of the at least one magnetoresistive element can be divided into an in-plane component parallel to the second plane and a perpendicular component perpendicular to the second plane. The in-plane component has a second direction that changes with a change in the first direction. The direction of the first magnetization changes with a change in the second direction. The detection value depends on the direction of the first magnetization.

In the magnetic sensor according to the present invention, the first magnetic layer may have a characteristic that the first magnetization is saturated by the magnetic field to be detected if the first direction is in at least part of the variable range.

In the magnetic sensor according to the present invention, the at least one magnetoresistive element may each further include a second magnetic layer having second magnetization in a direction parallel to the second plane, and a gap layer located between the first magnetic layer and the second magnetic layer.

In the magnetic sensor according to the present invention, the dihedral angle may be in a range of 30° to 84°.

The magnetic sensor according to the present invention may include a first magnetoresistive element and a second magnetoresistive element as the at least one magnetoresistive element. In this case, the magnetic sensor may further include a signal output node. The first and second magnetoresistive elements may be connected in series via the signal output node. The detection value may depend on a potential of the signal output node.

The magnetic sensor according to the present invention may further include a substrate that supports the at least one magnetoresistive element. The substrate may include a main surface perpendicular to the first plane and at least one slope oblique to the main surface. The at least one magnetoresistive element may be located on the at least one slope. The second plane corresponding to each of the at least one magnetoresistive element may be parallel to the slope on which each of the at least one magnetoresistive element is located. It will be understood that the slope here is a flat surface (plane). In the present invention, that two planes are parallel, like the second plane and the slope are parallel, covers a situation where the two planes overlap.

If the magnetic sensor according to the present invention includes the substrate, the magnetic sensor may include a first magnetoresistive element and a second magnetoresistive element as the at least one magnetoresistive element. The substrate may include, as the at least one slope, a first slope on which the first magnetoresistive element is located and a second slope on which the second magnetoresistive element is located. The second plane corresponding to the first magnetoresistive element may be parallel to the first slope. The second plane corresponding to the second magnetoresistive element may be parallel to the second slope.

If the magnetic sensor according to the present invention includes the substrate and the first and second magnetoresistive elements, the magnetic sensor may further include a signal output node. The first and second magnetoresistive elements may be connected in series via the signal output node. The detection value may depend on a potential of the signal output node.

If the magnetic sensor according to the present invention includes the substrate and the first and second magnetoresistive elements, the first and second magnetoresistive elements may be connected in series. The detection value may depend on a combined resistance of the first and second magnetoresistive elements.

The magnetic sensor according to the present invention may further include a first magnetic detection unit that includes the at least one magnetoresistive element and generates a first detection signal dependent on the direction of the first magnetization, a second magnetic detection unit that detects the magnetic field to be detected and generates a second detection signal dependent on the first direction, and a detection value generation unit that generates the detection value on the basis of the first detection signal and the second detection signal. The variable range may include a first region and a second region that are different from each other. In this case, two candidates for the first direction corresponding to a specific same value of the first detection signal may fall within the respective first and second regions. Two values of the second detection signal corresponding to the two candidates may be different from each other.

A magnetic sensor system according to the present invention includes the magnetic sensor according to the present invention and a magnetic field generator that generates the magnetic field to be detected. The magnetic sensor and the magnetic field generator may be configured such that the first direction changes as a relative position of the magnetic field generator with respect to the magnetic sensor changes. In this case, the relative position of the magnetic field generator with respect to the magnetic sensor may be rotatable about the magnetic sensor.

In the magnetic sensor and the magnetic sensor system according to the present invention, the first plane and the second plane intersect at a dihedral angle other than 90°. This prevents the strength of the in-plane component from becoming zero regardless of the first direction within the variable range as long as there is a magnetic field to be detected. For this reason, according to the present invention, the detection value corresponding to the direction of the magnetic field to be detected that changes in direction within a variable range including a direction outside a predetermined plane can be generated by using a magnetoresistive element or elements suitable to detect a magnetic field that changes in direction within the predetermined plane while suppressing a drop in detection accuracy.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. Initially, a magnetic sensor system according to a first embodiment of the invention will be outlined with reference to FIGS. 1 and 2. A magnetic sensor system 1 according to the present embodiment includes a magnetic sensor 2 according to the present embodiment and a magnetic field generator 5 that generates a magnetic field to be detected.

Figure 1:
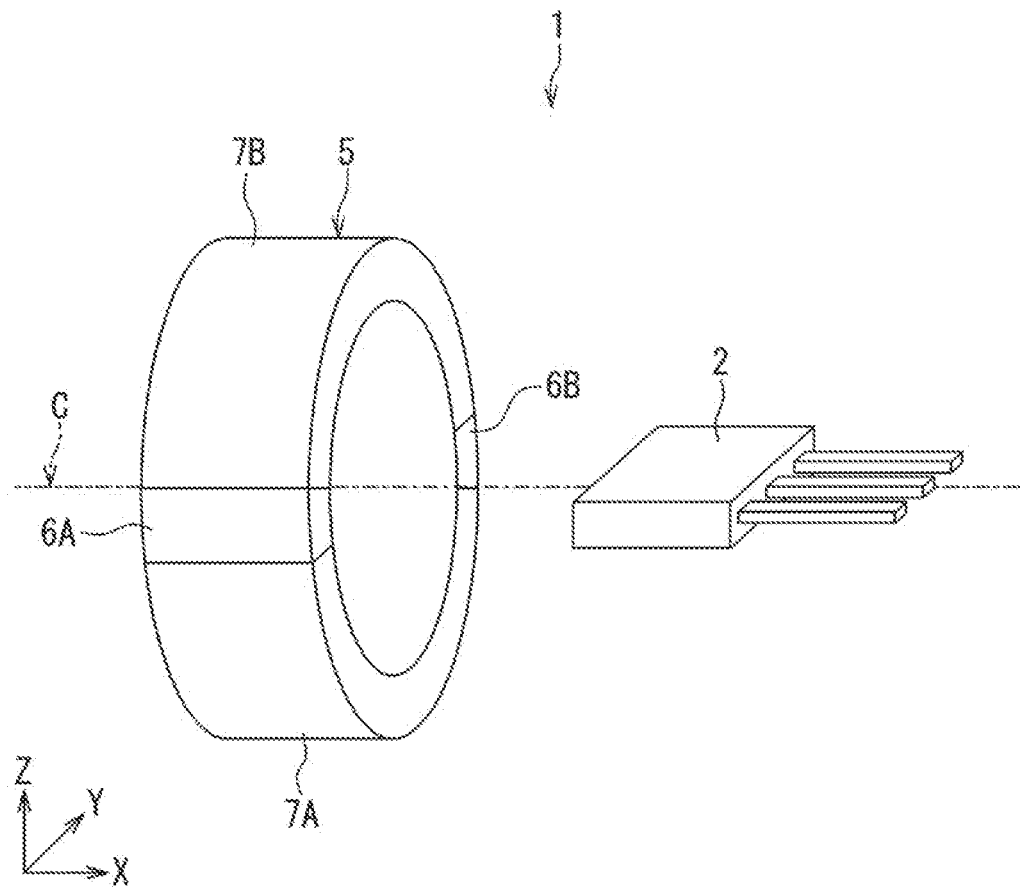
FIG. 1 is a perspective view showing a schematic configuration of a magnetic sensor system according to a first embodiment of the invention.

The magnetic field generator 5 has a ring shape with a rotation axis C at the center, and is rotatable about the rotation axis C. Considering the magnetic field generator 5 as a ring, the magnetic sensor 2 is located in a portion corresponding to the hole of the ring. The magnetic sensor 2 is located on the rotation axis C. In FIG. 1, the magnetic sensor 2 and the magnetic field generator 5 are shown to be separated from each other along the rotation axis C. The magnetic sensor 2 detects the magnetic field to be detected generated by the magnetic field generator 5, and generates a detection value θs. The detection value θs corresponds to a relative position, or rotational position in particular, of the magnetic field generator 5 with respect to the magnetic sensor 2.

The magnetic field generator 5 includes two magnets 6A and 6B and two yokes 7A and 7B. The magnets 6A and 6B are arranged at symmetrical positions with a virtual plane including the rotation axis C at the center. The magnets 6A and 6B each have an N pole and an S pole at respective ends in the direction of rotation of the magnetic field generator 5. The yoke 7A connects the N pole of the magnet 6A and the N pole of the magnet 6B. The yoke 7B connects the S pole of the magnet 6A and the S pole of the magnet 6B.

Figure 2:
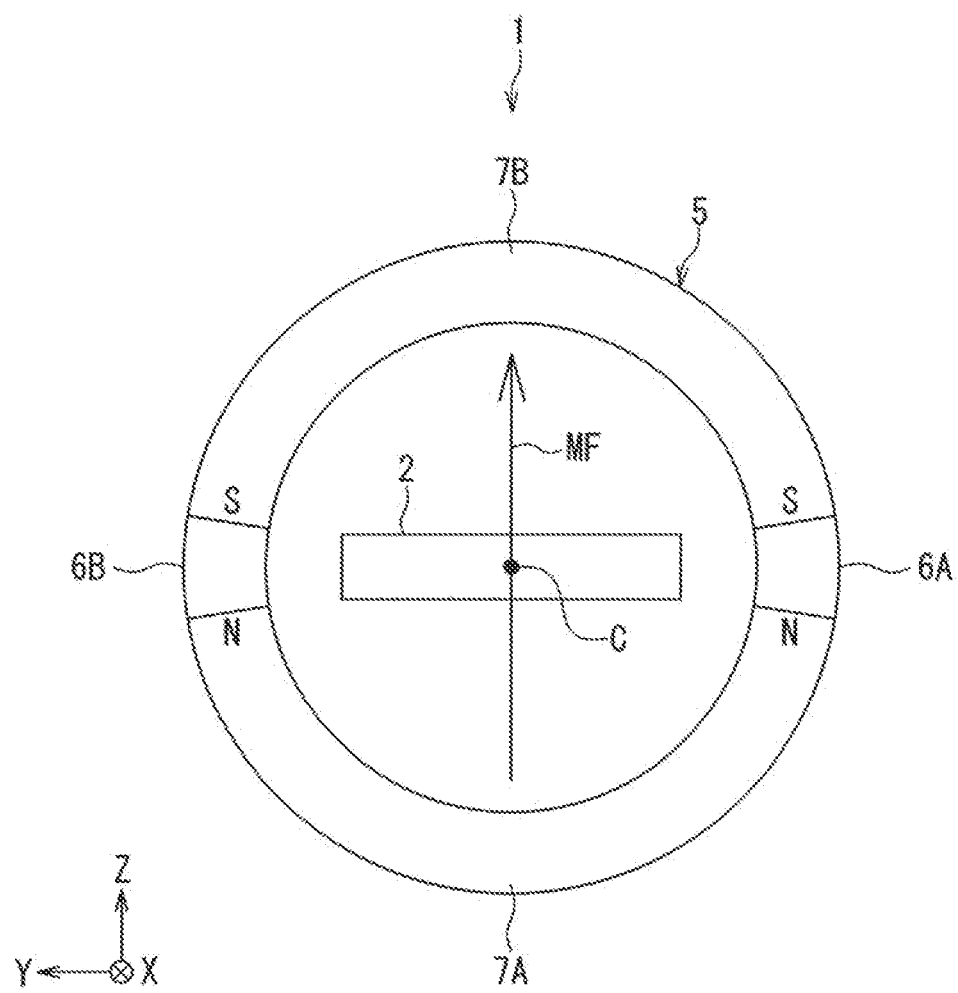
FIG. 2 is a front view showing a schematic configuration of a magnetic sensor system according to the first embodiment of the invention.

Now, we define X, Y, and Z directions as shown in FIGS. 1 and 2. The X, Y, and Z directions are orthogonal to one another. In the present embodiment, a direction parallel to the rotation axis C (in FIG. 1, rightward direction) will be referred to as the X direction. In FIG. 2, the Y direction is shown as a leftward direction. In FIGS. 1 and 2, the Z direction is shown as an upward direction. The opposite directions to the X, Y, and Z directions will be referred to as −X, −Y, and −Z directions, respectively.

Figure 3:
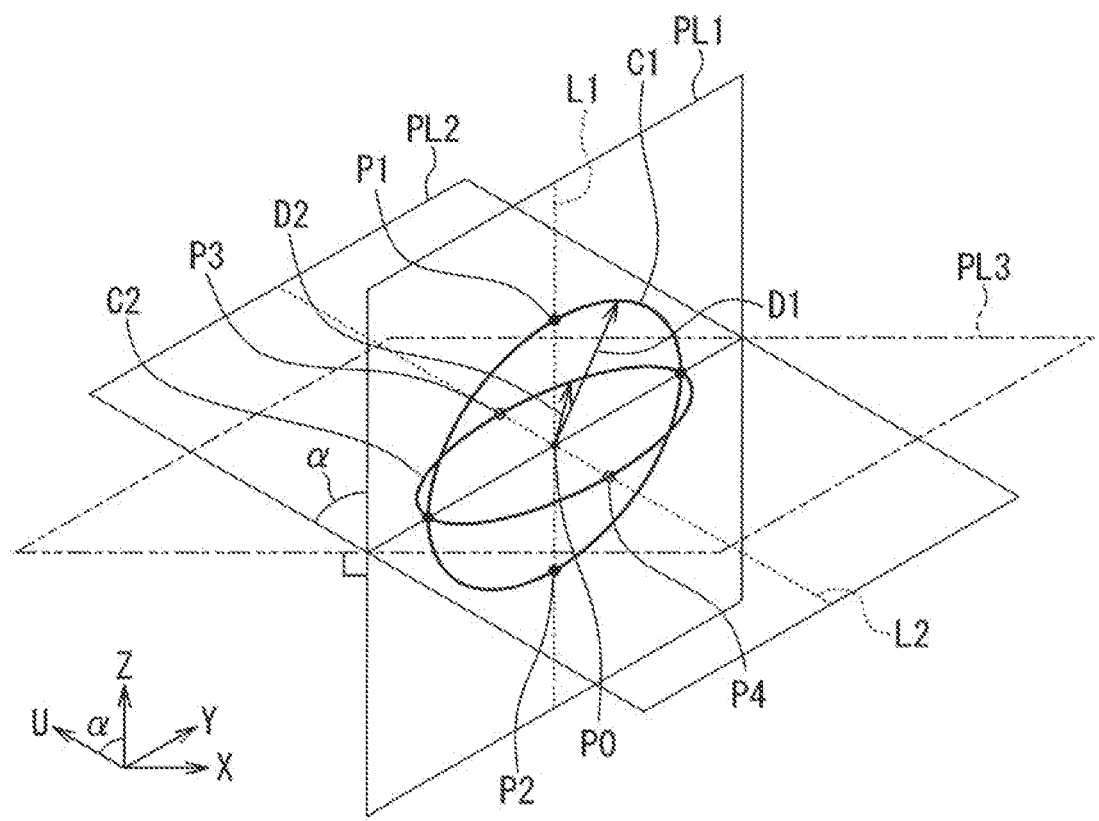
FIG. 3 is an explanatory diagram for describing a magnetic field to be detected of the first embodiment of the invention.
Figure 4:
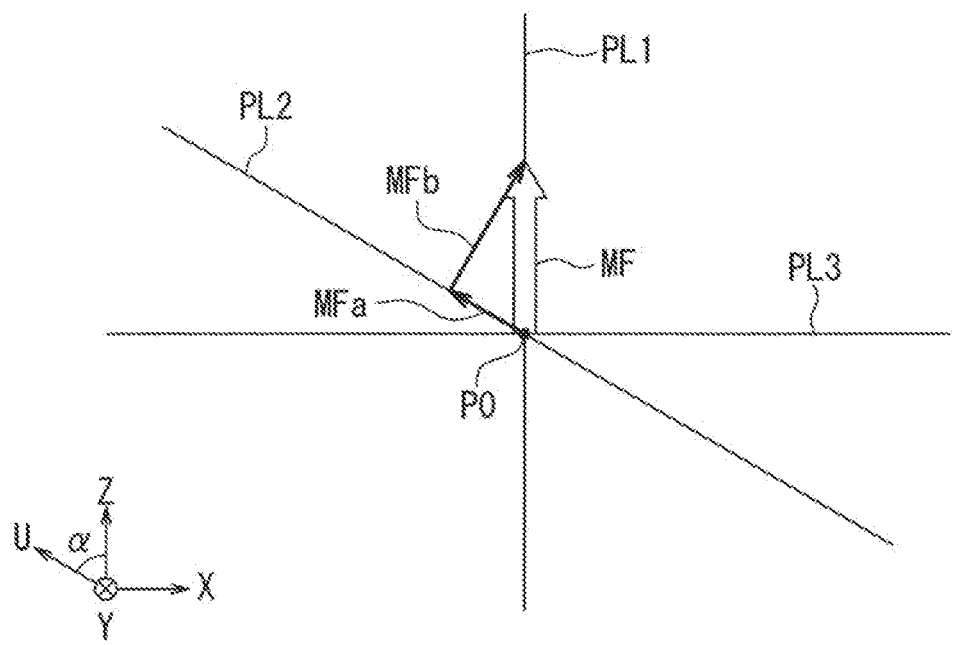
FIG. 4 is an explanatory diagram showing an in-plane component and a perpendicular component of the magnetic field to be detected of the first embodiment of the invention.

Next, the magnetic field to be detected generated by the magnetic field generator 5 will be described with reference to FIGS. 1 to 4. FIG. 3 is an explanatory diagram for describing the magnetic field to be detected. FIG. 4 is an explanatory diagram showing an in-plane component and a perpendicular component of the magnetic field to be detected.

In the present embodiment, both a magnetic flux occurring from the N pole of the magnet 6A and a magnetic flux occurring from the N pole of the magnet 6B flow out of the yoke 7A into the yoke 7B. This generates a magnetic field to be detected MF directed from the yoke 7A to the yoke 7B.

In FIGS. 3 and 4, a plane denoted by the symbol PL1 represents a YZ plane intersecting the magnetic sensor 2 and the magnetic field generator 5. This plane will hereinafter be referred to as a first plane PL1. The magnetic field to be detected MF has a first direction D1 at a reference position P0 within the first plane PL1. The reference position P0 is located inside or at the surface of the magnetic sensor 2. The first direction D1 changes within a predetermined variable range in the first plane PL1. In FIG. 3, the arrow denoted by the symbol D1 represents the first direction D1 and the strength of the magnetic field to be detected MF at the reference position P0. The end of the arrow denoted by the symbol D1 moves along a circle denoted by the symbol C1. In the present embodiment, the variable range of the first direction D1 is 180° or less in size.

The magnetic sensor 2 and the magnetic field generator 5 are configured such that the first direction D1 changes as the relative position of the magnetic field generator 5 with respect to the magnetic sensor 2 changes. More specifically, as the magnetic field generator 5 rotates about the rotation axis C, the relative position of the magnetic field generator 5 with respect to the magnetic sensor 2 rotates about the magnetic sensor 2. The first direction D1 thus rotates about the reference position P0.

In FIGS. 3 and 4, a plane denoted by the symbol PL3 represents an XY plane passing the reference position P0. This plane will hereinafter be referred to as a reference plane PL3.

In the present embodiment, a second plane related to the magnetic sensor 2 is defined. The second plane is oblique to both the first plane PL1 and the reference plane PL3. The first plane PL1 and the second plane intersect at a dihedral angle α other than 90°. The dihedral angle α is greater than 0° and smaller than 90°. The second plane of the present embodiment is a plane obtained by rotating the XY plane about an axis in the Y direction by an angle of 90°-α. A plane PL2 shown in FIGS. 3 and 4 is an example of the second plane. The plane PL2 shown in FIGS. 3 and 4 passes the reference position P0. However, the second plane does not necessarily pass the reference position P0.

A direction rotated from the Z direction toward the −X direction by α will be referred to as a U direction. The direction opposite to the U direction will be referred to as a −U direction. The plane PL2 is a plane parallel to the U direction and the Y direction, i.e., a UY plane.

As shown in FIG. 4, the magnetic field to be detected MF at the reference position P0 can be divided into an in-plane component MFa parallel to the plane PL2 and a perpendicular component MFb perpendicular to the plane PL2. FIG. 4 shows a state where the first direction D1 that is the direction of the magnetic field to be detected MF at the reference position P0 coincides with the Z direction. The in-plane component MFa has a second direction D2 that changes with a change in the first direction D1. In FIG. 3, the arrow denoted by the symbol D2 represents the second direction D2 and the strength of the in-plane component MFa. The end of the arrow denoted by the symbol D2 moves along an ellipse denoted by the symbol C2.

FIG. 3 shows a virtual line L1, a virtual line L2, and intersections P1, P2, P3, and P4. The virtual line L1 passes the reference position P0 and is parallel to the Z direction. The virtual line L2 passes the reference position P0 and is parallel to the U direction. The intersections P1 and P2 are those of the virtual line L1 and the circle C1. The intersections P3 and P4 are those of the virtual line L2 and the ellipse C2. The virtual line L2, the ellipse C2, the intersections P3 and P4, and the second direction D2 are orthogonal projections of the virtual line L1, the circle C1, the intersections P1 and P2, and the first direction D1 upon the plane PL2, respectively.

The magnetic sensor 2 includes at least one magnetoresistive element (hereinafter, referred to as an MR element). In the present embodiment, a second plane is defined for each of the at least one MR element. In the present embodiment, each second plane intersects its corresponding MR element.

The at least one MR element each includes a first magnetic layer having first magnetization that can change in direction within the corresponding second plane. Like the magnetic field to be detected MF at the reference position P0, the magnetic field to be detected MF received by each of the at least one MR element can be divided into an in-plane component parallel to the second plane and a perpendicular component perpendicular to the second plane. Like the in-plane component MFa shown in FIG. 4, the in-plane component has a second direction that changes with a change in the first direction D1. The direction of the first magnetization in each of the at least one MR element changes with a change in the second direction. The detection value θs depends on the direction of the first magnetization.

Since the second direction changes with a change in the first direction D1, the direction of the first magnetization changes with a change in the first direction D1. The detection value θs thus corresponds to the first direction D1.

If the magnetic sensor 2 includes a plurality of MR elements, the plurality of MR elements are located within an area where no substantial difference occurs in the direction of the magnetic field to be detected MF depending on the positions where the plurality of MR elements receive the magnetic field to be detected MF. The directions of the magnetic field to be detected MF received by the plurality of MR elements are thus substantially the same.

Figure 5:
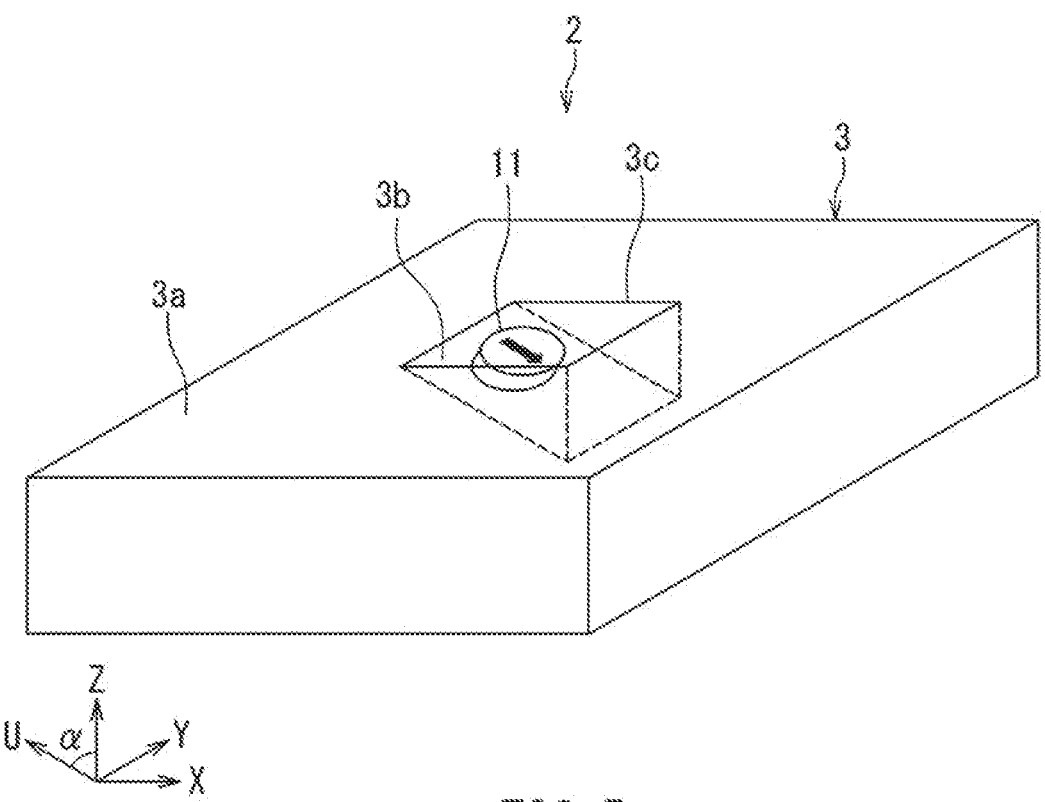
FIG. 5 is a perspective view showing a magnetic sensor according to the first embodiment of the invention.
Figure 6:
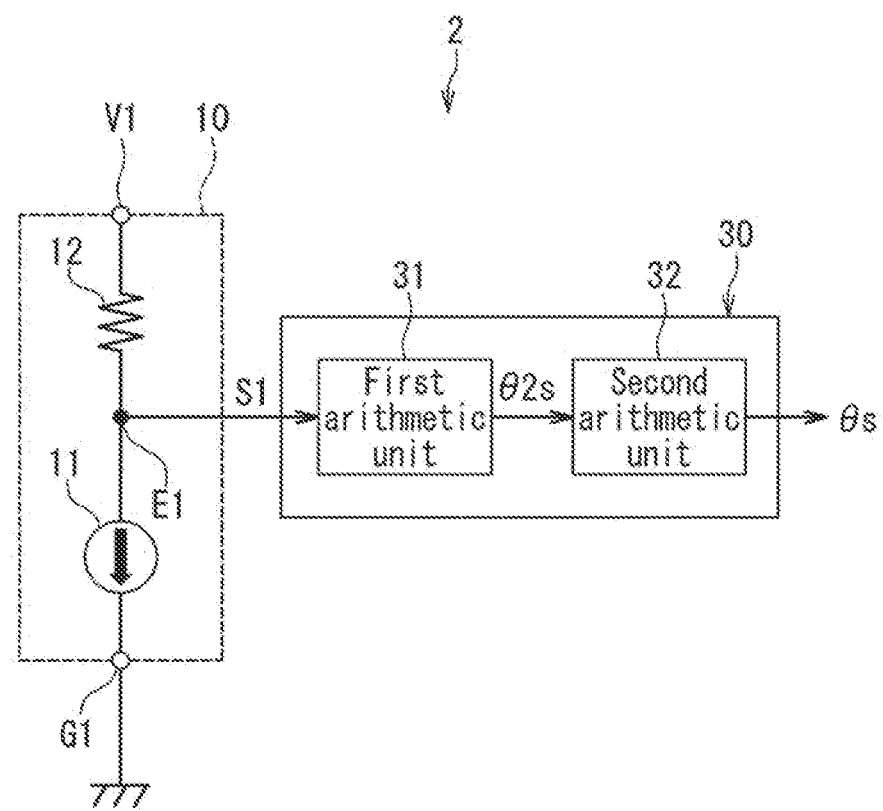
FIG. 6 is a circuit diagram showing a configuration of the magnetic sensor according to the first embodiment of the invention.

Next, a configuration of the magnetic sensor 2 will be described with reference to FIGS. 5 and 6. FIG. 5 is a perspective view showing the magnetic sensor 2. FIG. 6 is a circuit diagram showing the configuration of the magnetic sensor 2. As shown in FIG. 6, in the present embodiment, the magnetic sensor 2 includes a first magnetic detection unit 10 that includes at least one MR element and generates a first detection signal S1 dependent on the direction of first magnetization. In the present embodiment, the first magnetic detection unit 10 includes an MR element 11.

As shown in FIG. 5, the magnetic sensor 2 further includes a substrate 3 that supports the MR element 11. The substrate 3 includes a main surface 3a perpendicular to the first plane PL1 (YZ plane) shown in FIGS. 3 and 4. In particular, in the present embodiment, the main surface 3a is parallel to the reference plane PL3 (XY plane) shown in FIGS. 3 and 4.

The substrate 3 further includes a groove portion 3c open in the main surface 3a. The groove portion 3c includes a slope 3b oblique to the main surface 3a. The slope 3b is a flat surface. The MR element 11 is located on the slope 3b. The second plane corresponding to the MR element 11 is parallel to the slope 3b.

In the present embodiment, the position where the MR element 11 is located is the reference position P0. The plane PL2 shown in FIGS. 3 and 4 is the second plane corresponding to the MR element 11. For the sake of convenience, in the present embodiment, the second plane corresponding to the MR element 11 will be referred to as a second plane PL2. Like the second plane PL2, the slope 3b is tilted to form the dihedral angle α with respect to the first plane PL1 and is parallel to the UY plane.

In the present embodiment, the in-plane component MFa shown in FIG. 4 is the in-plane component of the magnetic field to be detected MF received by the MR element 11. The second direction D2 shown in FIG. 3 is the second direction of the in-plane component of the magnetic field to be detected MF received by the MR element 11. For the sake of convenience, in the present embodiment, the in-plane component of the magnetic field to be detected MF received by the MR element 11 will be referred to as an in-plane component MF2a. The second direction of the in-plane component of the magnetic field to be detected MF received by the MR element 11 will be referred to as a second direction D2.

As shown in FIG. 6, the first magnetic detection unit 10 further includes a resistor 12, a signal output node E1, a power supply node V1, and a ground node G1. Since the first magnetic detection unit 10 is part of the magnetic sensor 2, the magnetic sensor 2 can be said to include the resistor 12, the signal output node E1, the power supply node V1, and the ground node G1. The MR element 11 and the resistor 12 are connected in series via the signal output node E1. The resistor 12 is arranged between the power supply node V1 and the signal output node E1. The MR element 11 is arranged between the signal output node E1 and the ground node G1. A predetermined magnitude of power supply voltage is applied to the power supply node V1. The ground node G1 is grounded.

The MR element 11 may be a spin valve MR element or an anisotropic MR element. In particular, in the present embodiment, the MR element 11 is a spin valve MR element. In this case, the MR element 11 includes a second magnetic layer and a gap layer aside from the foregoing first magnetic layer. The second magnetic layer has second magnetization in a direction parallel to the second plane PL2. The gap layer is located between the first and second magnetic layers. The direction of the second magnetization does not change with a change in the second direction D2 of the in-plane component MFa. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the MR element 11 changes with an angle that the direction of the first magnetization of the first magnetic layer forms with the direction of the second magnetization of the second magnetic layer. The resistance is minimized if the angle is 0°. The resistance is maximized if the angle is 180°. In FIGS. 5 and 6, the thick arrow indicates the direction of the second magnetization. In the present embodiment, the direction of the second magnetization is the −U direction.

As described above, the direction of the first magnetization changes with a change in the second direction D2 of the in-plane component MFa. The second direction D2 changes with a change in the first direction D1 of the magnetic field to be detected MF. The resistance of the MR element 11 thus changes with a change in the first direction D1, and as a result, the signal output node E1 changes in potential. The first magnetic detection unit 10 generates a signal corresponding to the potential of the signal output node E1 as the first detection signal S1. The first detection signal S1 changes with a change in the first direction D1.

From the viewpoint of the manufacturing accuracy of the MR element 11, the direction of the second magnetization may be slightly different from the foregoing direction.

Figure 7:
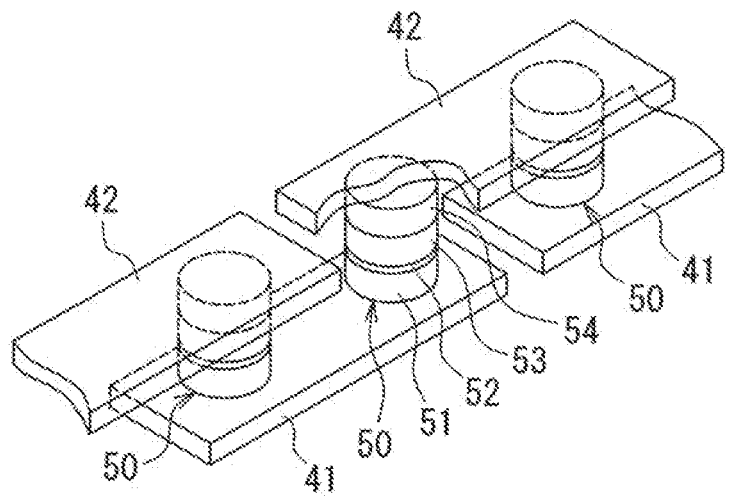
FIG. 7 is a perspective view showing a part of a magnetoresistive element of the first embodiment of the invention.

An example of the configuration of the MR element 11 will now be described with reference to FIG. 7. FIG. 7 is a perspective view showing a part of the MR element 11. In this example, the MR element 11 includes a plurality of lower electrodes 41, a plurality of MR films 50, and a plurality of upper electrodes 42. The plurality of lower electrodes 41 are located on the slope 3b of the substrate 3. Each of the lower electrodes 41 has a long slender shape. Every two lower electrodes 41 adjacent to each other in the longitudinal direction of the lower electrodes 41 have a gap therebetween. As shown in FIG. 7, MR films 50 are provided on the top surfaces of the lower electrodes 41, near opposite ends in the longitudinal direction. Each of the MR films 50 includes a first magnetic layer 51, a gap layer 52, a second magnetic layer 53, and an antiferromagnetic layer 54 which are stacked in this order, the first magnetic layer 51 being closest to the lower electrode 41. The first magnetic layer 51 is electrically connected to the lower electrode 41. The antiferromagnetic layer 54 is formed of an antiferromagnetic material. The antiferromagnetic layer 54 is in exchange coupling with the second magnetic layer 53 so as to pin the magnetization direction of the second magnetic layer 53. The plurality of upper electrodes 42 are arranged over the plurality of MR films 50. Each of the upper electrodes 42 has a long slender shape, and establishes electrical connection between the respective antiferromagnetic layers 54 of two adjacent MR films 50 that are arranged on two lower electrodes 41 adjacent in the longitudinal direction of the lower electrodes 41. With such a configuration, the plurality of MR films 50 in the MR element 11 shown in FIG. 7 are connected in series by the plurality of lower electrodes 41 and the plurality of upper electrodes 42. It should be appreciated that the layers 51 to 54 of the MR films 50 may be stacked in an order reverse to that shown in FIG. 7.

As shown in FIG. 6, the magnetic sensor 2 further includes a detection value generation unit 30 that generates the detection value θs on the basis of the first detection signal S1. The detection value θs depends on the first detection signal S1. Since the first detection signal S1 changes with a change in the first direction D1, the detection value θs corresponds to the first direction D1. The detection value generation unit 30 includes an application specific integrated circuit (ASIC) or a microcomputer, for example.

Next, a method for generating the detection value θs will be described. Here, the angle that the first direction D1 of the magnetic field to be detected MF forms with respect to a predetermined reference direction will be referred to as a first angle and denoted by the symbol θ1. The angle that the second direction D2 of the in-plane component MFa forms with respect to a predetermined reference direction will be referred to as a second angle and denoted by the symbol θ2. The second angle θ2 has a correlation with the first angle θ1.

Figure 8:
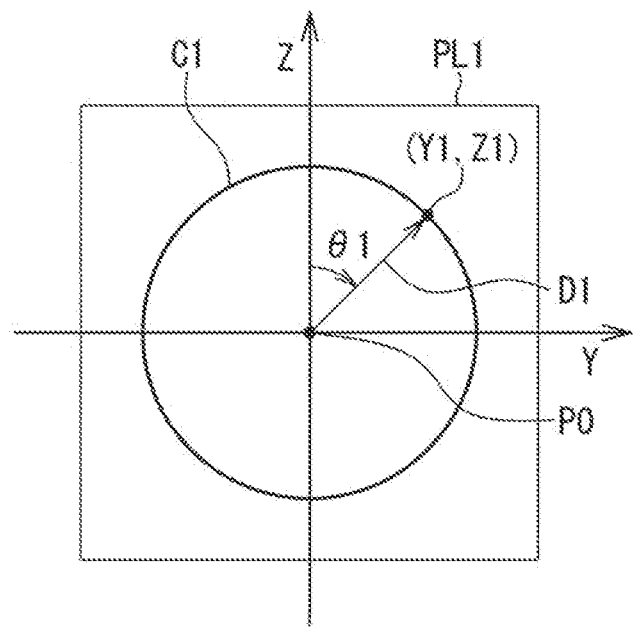
FIG. 8 is an explanatory diagram showing a definition of a first angle of the first embodiment of the invention.

FIG. 8 is an explanatory diagram showing the definition of the first angle θ1. FIG. 8 shows the first plane PL1, the reference position P0, the first direction D1, and the circle C1 shown in FIG. 3. In the first plane PL1, the first direction D1 rotates about the reference position P0. In the present embodiment, the Z direction serves as the reference direction for representing the first angle θ1. The first angle θ1 is expressed in positive values when seen clockwise from the Z direction in FIG. 8. The first angle θ1 is expressed in negative values when seen counterclockwise from the Z direction in FIG. 8.

As described above, in the present embodiment, the variable range of the first direction D1 is 180° or less in size. In the following description, the first angle θ1 shall change within the range of 0° or more and not more than 180°.

Figure 9:
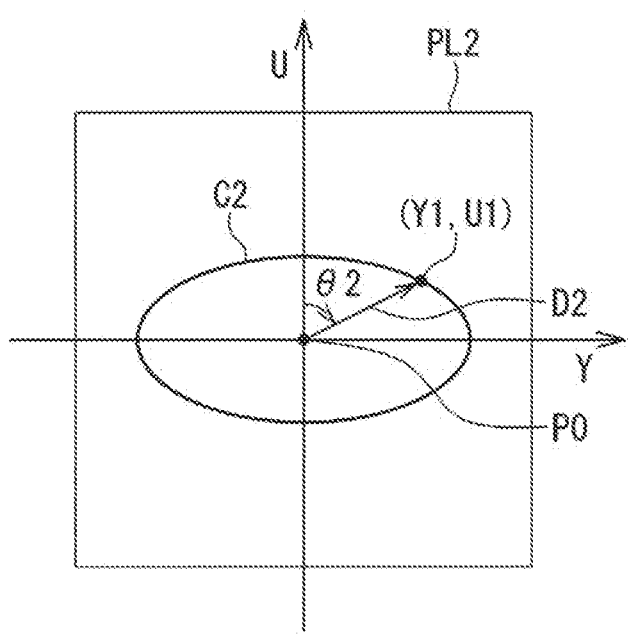
FIG. 9 is an explanatory diagram showing a definition of a second angle of the first embodiment of the invention.

FIG. 9 is an explanatory diagram showing the definition of the second angle θ2. FIG. 9 shows the plane PL2, i.e., the second plane PL2, the reference position P0, the second direction D2, and the ellipse C2 shown in FIG. 3. In the second plane PL2, the second direction D2 rotates about the position where the MR element 11 is located, i.e., the reference position P0. In the present embodiment, the U direction serves as the reference direction for representing the second angle θ2. The second angle θ2 is expressed in positive values when seen clockwise from the U direction in FIG. 9. The second angle θ2 is expressed in negative values when seen counterclockwise from the U direction in FIG. 9. In the present embodiment, the second angle θ2 changes within the range of 0° or more and not more than 180°.

The detection value generation unit 30 generates a value having a correlation with the first angle θ1 as the detection value θs. In the present embodiment, the detection value generation unit 30 generates a value representing the first angle θ1 itself as the detection value θs. Instead of the value representing the first angle θ1 itself, the detection value generation unit 30 may generate a value having a correlation with an angle representing the relative position of the magnetic field generator 5 with respect to the magnetic sensor 2 as the detection value θs. The angle representing the relative position of the magnetic field generator 5 with respect to the magnetic sensor 2 has a correlation with the first angle θ1.

A method for generating the detection value θs will be specifically described below. Initially, the method for generating the detection value θs will be outlined. The arrow indicating the first direction D1 shown in FIG. 8 can be said to represent a vector representing the direction and strength of the magnetic field to be detected MF received by the MR element 11 in the YZ coordinate system with the reference position P0 as the origin. This vector will hereinafter be referred to as a first vector. The Y component and the Z component of the first vector will be denoted by Y1 and Z1, respectively.

The arrow indicating the second direction D2 shown in FIG. 9 can be said to represent a vector representing the direction and strength of the in-plane component MFa received by the MR element 11 in the YU coordinate system with the reference position P0 as the origin. This vector will hereinafter be referred to as a second vector. The second vector is an orthogonal projection of the first vector on the second plane PL2. The Y component of the second vector has the same value as that of the Y component of the first vector, i.e., Y1. The Y and U components of the second vector will hereinafter be denoted by Y1 and U1, respectively.

Figure 10:
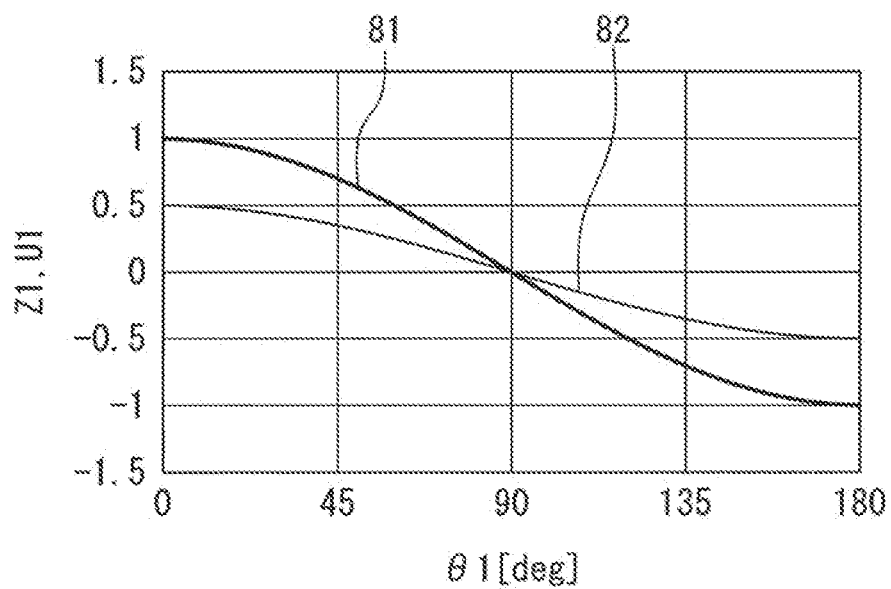
FIG. 10 is a waveform chart showing a change in a component of each of first and second vectors with respect to a change in the first angle of the first embodiment of the invention.

The U component U1 of the second vector has a correlation with the Z component Z1 of the first vector. FIG. 10 is a waveform chart showing changes in Z1 and U1 with respect to a change in the first angle θ1. In FIG. 10, the horizontal axis indicates the first angle θ1, and the vertical axis indicates Z1 and U1. In FIG. 10, a curve denoted by a reference numeral 81 represents Z1, and a curve denoted by a reference numeral 82 represents U1. In FIG. 10, Z1 is normalized so that Z1 has a maximum value of 1 and a minimum value of −1. FIG. 10 shows U1 for a case where the dihedral angle α is 60°.

Z1 can be expressed by using U1 and the dihedral angle α. The ratio Y1/Z1 can thus be expressed by using the ratio Y1/U1 and the dihedral angle α. An equation representing a relationship between the first angle θ1 and the second angle θ2 can be obtained by using a relationship between the ratio Y1/Z1 and the first angle θ1, a relationship between the ratio Y1/U1 and the second angle θ2, and a relationship between the ratio Y1/Z1 and the ratio Y1/U1.

A value θ2s representing the second angle θ2 can be determined by using the first detection signal S1. In the present embodiment, the detection value generation unit 30 generates the detection value θs by determining θ2s and substituting θ2s into the equation representing the relationship between the first angle θ1 and the second angle θ2.

Next, a specific method for calculating the detection value θs will be described. The ratio Y1/Z1 and the ratio Y1/U1 are represented by the following Eqs. (1) and (2), respectively:

$$Y1/Z1 = \tan\theta1, \quad (1), \text{ and}$$

$$Y1/U1 = \tan\theta2. \quad (2)$$

Z1 is represented by the following Eq. (3):

$$Z1 = U1/\cos\alpha. \quad (3)$$

Transforming Eq. (1) and substituting Eqs. (2) and (3) into the transformed equation yields the following Eq. (4):

$$\begin{aligned}\theta1 &= a\tan(Y1/Z1) \\ &= a\tan(Y1/(U1/\cos\alpha)) \\ &= a\tan(\cos\alpha \cdot Y1/U1) \\ &= a\tan(\cos\alpha \cdot \tan\theta2).\end{aligned} \quad (4)$$

Eq. (4) represents the relationship between the first angle θ1 and the second angle θ2. The symbol "a tan" represents the arctangent.

The first detection signal S1 can be normalized so that the first detection signal S1 has a value of 1 if the second angle θ2 is 0°, a value of −1 if the second angle θ2 is 180°, and a value of 0 if the second angle θ2 is 90° or 270°. In this case, the first detection signal S1 can be represented by the following Eq. (5):

$$S1 = \cos\theta2. \quad (5)$$

FIG. 6 shows an example of the configuration of the detection value generation unit 30. In this example, the detection value generation unit 30 includes a first arithmetic unit 31 and a second arithmetic unit 32. The first arithmetic unit 31 calculates the value θ2s representing the second angle θ2 on the basis of the first detection signal S1. The second arithmetic unit 32 calculates the detection value θs on the basis of the value θ2s calculated by the first arithmetic unit 31. The first and second arithmetic units 31 and 32 may be functional blocks or physically separate circuits.

The first arithmetic unit 31 calculates the value θ2s by the following Eq. (6).

$$\theta2s = a\cos S1. \quad (6)$$

The range of the value θ2s is 0° or more and not more than 180°. Eq. (6) is obtained by replacing θ2 in Eq. (5) with θ2s and transforming the resultant. The symbol "a cos" represents the arccosine.

The second arithmetic unit 32 calculates the detection value θs by the following Eq. (7) excluding the exceptions to be described later:

$$\theta s = a\tan(\cos\alpha \cdot \tan\theta2s). \quad (7)$$

The range of the detection value θs is 0° or more and not more than 180°. Eq. (7) is obtained by replacing θ1 and θ2 in Eq. (4) with θs and θ2s respectively and transforming the resultant.

The foregoing exceptions refer to situations where the value θ2s is 0° or 180°. If the value θ2s is 0° or 180°, θs in Eq. (7) has two solutions, 0° and 180°. The second arithmetic unit 32 then simply uses the value θ2s itself as the detection value θs if the value θ2s is 0° or 180°. Such exception handling uses the fact that if the first angle θ1 is 0°, the second angle θ2 is also 0°, and if the first angle θ1 is 180°, the second angle θ2 is also 180°.

The configuration and function of the detection value generation unit 30 are not limited to the foregoing example. For example, the detection value generation unit 30 may retain a table indicating the correspondence between the first detection signal S1 and the detection value θs, and generate the detection value θs from the first detection signal S1 by referring to the table. The correspondence between the first detection signal S1 and the detection value θs in the foregoing table may be theoretically determined as described above, or determined by experiment.

Next, the operation and effect of the magnetic sensor system 1 and the magnetic sensor 2 according to the present embodiment will be described. The first magnetic detection unit 10 of the magnetic sensor 2 according to the present embodiment includes the MR element 11. The MR element 11 includes the first magnetic layer having the first magnetization that can change in direction within a predetermined plane, namely, the second plane PL2. The MR element 11 is thus suitable to detect the magnetic field that changes in direction within the predetermined plane, i.e., the second plane PL2.

Meanwhile, the magnetic field to be detected MF at the reference position P0 has the first direction D1 that changes within a predetermined variable range in the first plane PL1 (YZ plane). In other words, the first direction D1 of the magnetic field to be detected MF changes within a variable range including a direction outside the foregoing predetermined plane. According to the present embodiment, the detection value θs corresponding to the first direction D1 of the magnetic field to be detected MF that changes in direction within the variable range including a direction outside the predetermined plane, namely, the second plane PL2 can be generated by using the MR element 11 suitable to detect a magnetic field that changes in direction within the predetermined plane in the following manner.

In the present embodiment, the MR element 11 is located on the slope 3b of the substrate 3, and the second plane PL2 corresponding to the MR element 11 is tilted to form a dihedral angle α with respect to the first plane PL1. The MR element 11 can thus detect the in-plane component MFa that is a component of the magnetic field to be detected MF. The second direction D2 that is the direction of the in-plane component MFa changes with a change in the first direction D1 that is the direction of the magnetic field to be detected MF at the reference position P0. In the MR element 11, the direction of the first magnetization changes with a change in the second direction D2. The detection value θs depends on the direction of the first magnetization. The detection value θs therefore corresponds to the first direction D1. According to the present embodiment, the detection value θs corresponding to the first direction D1 can thus be generated by using the MR element 11.

Now, if the second plane PL2 is a plane perpendicular to the first plane PL1, the strength of the in-plane component MFa may have a value of 0 or near 0 depending on the first direction D1. An example of the case where the second plane PL2 is perpendicular to the first plane PL1 is where the second plane PL2 is a plane obtained by rotating the XY plane about an axis in the X direction by an angle greater than 0° and smaller than 90°. In this case, the strength of the in-plane component MFa has a value of 0 if the first direction D1 is perpendicular to the second plane PL2, and a value near 0 if the first direction D1 is almost perpendicular to the second plane PL2. Thus, if the strength of the in-plane component MFa has a value of 0 or near 0, the detection accuracy of the magnetic sensor 2 drops greatly with respect to variations in the strength of the magnetic field to be detected MF.

In the present embodiment, the first plane PL1 and the second plane PL2 intersect at a dihedral angle α other than 90°. This prevents the strength of the in-plane component MFa from becoming zero regardless of the first direction D1 within the variable range as long as there is a magnetic field to be detected MF. According to the present embodiment, the detection value θs corresponding to the first direction D1 of the magnetic field to be detected MF can thus be generated by using the MR element 11 while suppressing a drop in the detection accuracy.

In the present embodiment, the first plane PL1 is perpendicular to the main surface 3a of the substrate 3. According to the present embodiment, the positional relationship between the magnetic sensor 2 and the magnetic field generator 5 can therefore be easily defined.

A favorable range of the dihedral angle α will now be described. Assuming that the magnetic field to be detected MF has a strength of H1, the minimum value of the strength of the in-plane component MFa is H1·cos α. The minimum value of the strength of the in-plane component MFa is preferably 10% or more of H1, more preferably 30% or more. The dihedral angle α is thus preferably 84° or less, more preferably 73° or less. Too small a dihedral angle α can make it difficult to form the MR element 11 on the slope 3b of the substrate 3. The dihedral angle α is therefore preferably 30° or greater, more preferably 45° or greater. In summary, the dihedral angle α is preferably in the range of 30° to 84°, more preferably in the range of 45° to 73°.

The direction of the first magnetization in the first magnetic layer of the MR element 11 preferably follows a change in the second direction D2 of the in-plane component MFa with high accuracy. For that purpose, the first magnetic layer preferably has a characteristic that the first magnetization is saturated by the magnetic field to be detected MF if the first direction D1 of the magnetic field to be detected MF is in at least a part of the variable range. The first magnetic layer more preferably has a characteristic that the first magnetization is saturated by the magnetic field to be detected MF regardless of what direction within the variable range the first direction D1 is.

If the MR element 11 is a spin valve MR element, the first magnetic layer preferably has a small uniaxial magnetic anisotropy in order for the direction of the first magnetization of the first magnetic layer to follow a change in the second direction D2 with high accuracy.

The first magnetic layer of the MR element 11 may have a characteristic that the first magnetization is saturated by the magnetic field to be detected MF regardless of what direction within the variable range the first direction D1 is. In this case, the direction of the first magnetization of the first magnetic layer does not vary depending on variations in the strength of the magnetic field to be detected MF. This can reduce variations in the detection value θs due to variations in the strength of the magnetic field to be detected MF. The strength of the magnetic field to be detected MF can vary, for example, due to a change in the ambient temperature and variations in the positional relationship between the magnetic sensor 2 and the magnetic field generator 5.

In the present embodiment, the variable range of the first direction D1 is 180° or less in size. In particular, in the present embodiment, as the magnetic field generator 5 rotates about the rotation axis C, the relative rotational position of the magnetic field generator 5 with respect to the magnetic sensor 2 changes, and as a result, the first direction D1 changes. The variable range of the relative rotational position of the magnetic field generator 5 with respect to the magnetic sensor 2 is also 180° or less. The magnetic sensor system 1 according to the present embodiment can thus be used as a device for detecting the rotational position of a rotatable moving part in an apparatus that includes the moving part and where the variable range of the moving part is 180° or less. An example of such an apparatus is a throttle.

Figure 11:
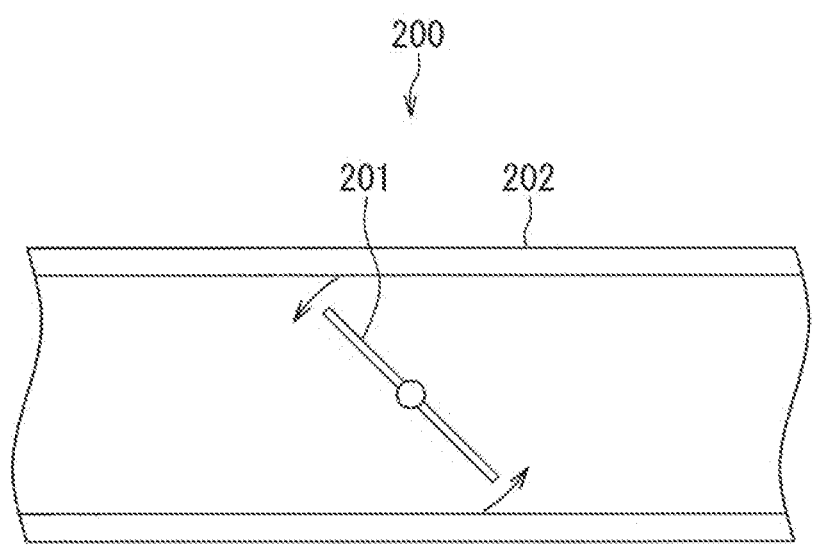
FIG. 11 is an explanatory diagram showing a configuration of a throttle to which the magnetic sensor system according to the first embodiment of the invention can be applied.

FIG. 11 is an explanatory diagram showing a configuration of a throttle to which the magnetic sensor system 1 according to the present embodiment can be applied. A throttle 200 shown in FIG. 11 includes a throttle valve 201 that is a moving part and a main body 202 that rotatably supports the throttle value 201 about a predetermined rotation axis. If the magnetic sensor system 1 is applied to the throttle 200, for example, the magnetic sensor system 1 may be configured so that the magnetic field generator 5 rotates along with the throttle valve 201 without the magnetic sensor 2 rotating along with the throttle valve 201.

The variable range of the throttle valve 201 is 90° or less in size. If the magnetic sensor system 1 is applied to the throttle 200, the magnetic sensor system 1 can be configured such that θ1 and θ2 shown in FIGS. 8 and 9 become 90° when the rotational position of the throttle valve 201 comes to the center position of the variable range. This configuration can improve the linearity of change of the first detection signal S1 with respect to a change in the rotational position of the throttle valve 201.

Another example of the apparatus to which the magnetic sensor system 1 according to the present embodiment can be applied is a gearshift. The gearshift includes a lever and a support unit that swingably supports the lever. If the magnetic sensor system 1 is applied to the gearshift, the magnetic sensor system 1 can be configured such that the magnetic field generator 5 rotates along with the lever without the magnetic sensor 2 rotating along with the lever.

Second Embodiment

Figure 12:
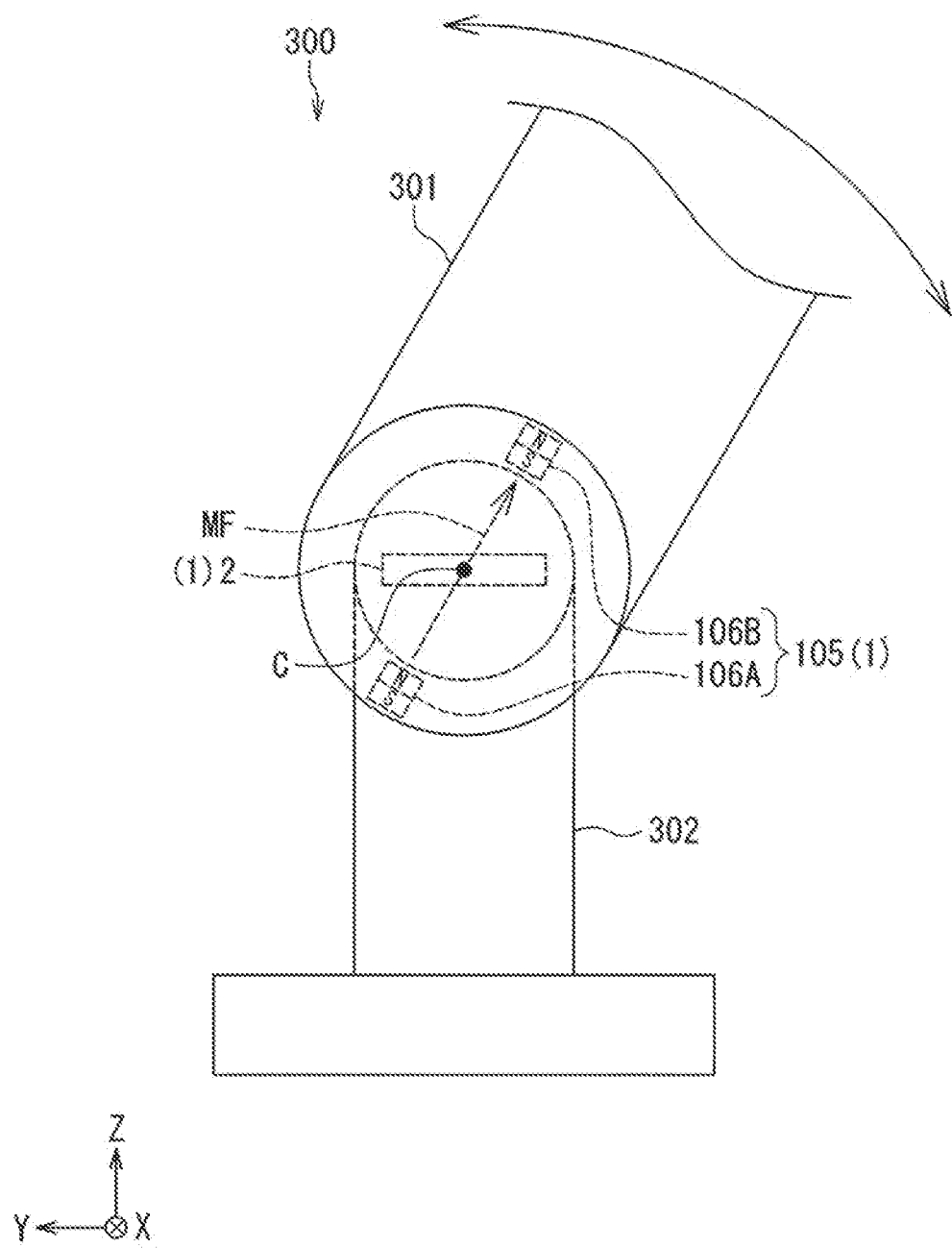
FIG. 12 is an explanatory diagram showing a schematic configuration of a magnetic sensor system according to a second embodiment of the invention.

A second embodiment of the invention will now be described. Initially, differences of a magnetic sensor system 1 according to the present embodiment from that according to the first embodiment will be described with reference to FIG. 12. FIG. 12 is an explanatory diagram showing a schematic configuration of the magnetic sensor system 1.

The magnetic sensor system 1 according to the present embodiment includes a magnetic field generator 105 that generates a magnetic field to be detected MF instead of the magnetic field generator 5 of the first embodiment. The magnetic field generator 105 is rotatable about a rotation axis C. The magnetic field generator 105 includes a pair of magnets 106A and 106B. The magnets 106A and 106B are located at positions symmetrical about a virtual plane including the rotation axis C.

The magnets 106A and 106B each include an N pole and an S pole. The magnets 106A and 106B are situated so that the N pole of the magnet 106A is opposed to the S pole of the magnet 106B. In the present embodiment, the magnetic field generator 105 generates a magnetic field to be detected MF directed from the N pole of the magnet 106A to the S pole of the magnet 106B.

The magnetic sensor 2 is configured such that the first direction D1 (see FIGS. 3 and 8) of the magnetic field to be detected MF changes as the relative position of the magnetic field generator 105 with respect to the magnetic sensor 2 changes. More specifically, as the magnetic field generator 105 rotates about the rotation axis C, the relative position of the magnetic field generator 105 with respect to the magnetic sensor 2 rotates about the magnetic sensor 2. The first direction D1 of the magnetic field to be detected MF thus rotates about the reference position P0.

In the present embodiment, the variable range of the first direction D1 and the variable ranges of the magnets 106A and 106B are all within 360°. The magnetic sensor system 1 according to the present embodiment can thus be used as a device for detecting the rotational position of a rotatable moving part in an apparatus that includes the moving part and the variable range of the moving part is within 360°. Examples of such an apparatus include a joint of an industrial robot. FIG. 12 shows an example where the magnetic sensor system 1 is applied to an industrial robot 300.

The industrial robot 300 shown in FIG. 12 includes a moving part 301 and a support unit 302 that rotatably supports the moving part 301. The moving part 301 and the support unit 302 are connected at a joint. The moving part 301 rotates about a rotation axis C. The variable range of the moving part 301 is within 360°. For example, if the magnetic sensor system 1 according to the present embodiment is applied to the joint of the industrial robot 300, the magnetic sensor 2 may be fixed to the support unit 302, and the magnets 106A and 106B may be fixed to the moving part 301.

Figure 13:
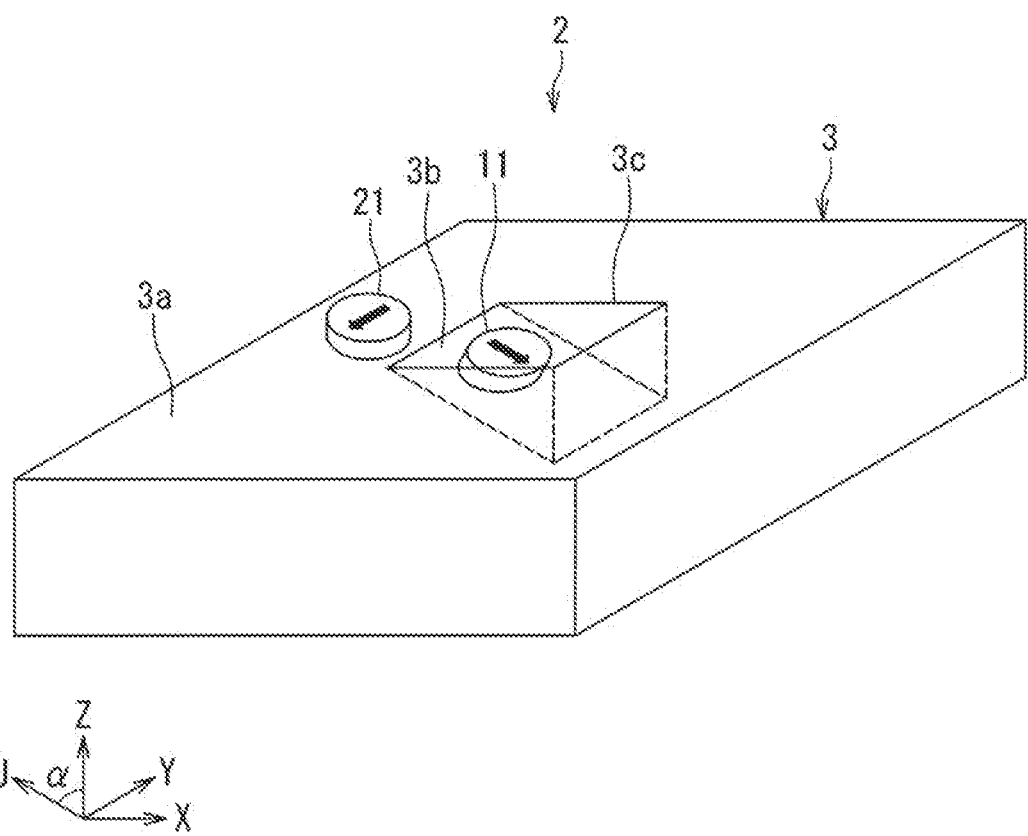
FIG. 13 is a perspective view showing a magnetic sensor according to the second embodiment of the invention.
Figure 14:
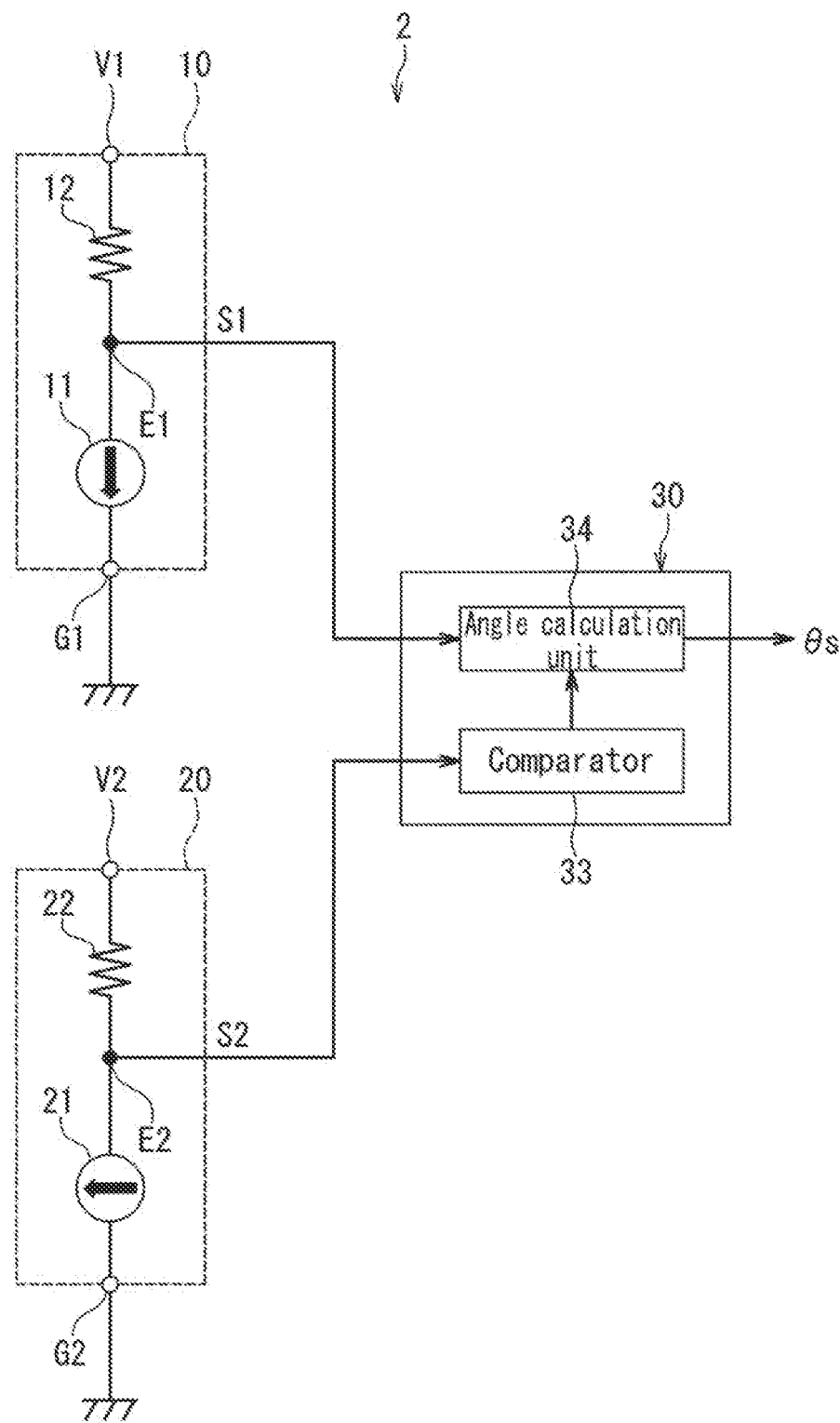
FIG. 14 is a circuit diagram showing a configuration of the magnetic sensor according to the second embodiment of the invention.

Next, differences of the magnetic sensor 2 according to the present embodiment from that according to the first embodiment will be described with reference to FIGS. 13 and 14. FIG. 13 is a perspective view showing the magnetic sensor 2. FIG. 14 is a circuit diagram showing a configuration of the magnetic sensor 2. As shown in FIG. 14, the magnetic sensor 2 according to the present embodiment includes a second magnetic detection unit 20 aside from the first magnetic detection unit 10 and the detection value generation unit 30. The second magnetic detection unit 20 detects the magnetic field to be detected MF and generates a second detection signal S2 dependent on the first direction D1. In the present embodiment, the detection value generation unit 30 generates the detection value θs on the basis of the first detection signal S1 and the second detection signal S2. The detection value θs corresponds to a relative position, or rotational position in particular, of the magnetic field generator 105 with respect to the magnetic sensor 2.

The second magnetic detection unit 20 includes an MR element 21 shown in FIGS. 13 and 14. The MR element 21 is located on the main surface 3a of the substrate 3. The second magnetic detection unit 20 further includes a resistor 22, a signal output node E2, a power supply node V2, and a ground node G2. The MR element 21 and the resistor 22 are connected in series via the signal output node E2. The resistor 22 is arranged between the power supply node V2 and the signal output node E2. The MR element 21 is arranged between the signal output node E2 and the ground node G2. A predetermined magnitude of power supply voltage is applied to the power supply node V2. The ground node G2 is grounded.

The MR element 11 of the first magnetic detection unit 10 and the MR element 21 of the second magnetic detection unit 20 are located within an area where no substantial difference occurs in the direction of the magnetic field to be detected MF depending on the positions where the MR elements 11 and 21 receive the magnetic field to be detected MF. The directions of the magnetic field to be detected MF received by the MR elements 11 and 21 are thus substantially the same.

In the present embodiment, the MR element 21 is a spin valve MR element like the MR element 11. The MR element 21 includes a third magnetic layer, a fourth magnetic layer, and a gap layer. The third magnetic layer has third magnetization that can change in direction within a virtual plane parallel to the reference plane PL3 (XY plane). The fourth magnetic layer has fourth magnetization in a direction parallel to the foregoing virtual plane. The gap layer is located between the third and fourth magnetic layers. The resistance of the MR element 21 changes with an angle that the direction of the third magnetization of the third magnetic layer forms with respect to the direction of the fourth magnetization of the fourth magnetic layer. The resistance is minimized if the angle is 0°. The resistance is maximized if the angle is 180°. In FIGS. 13 and 14, the thick arrow in the MR element 21 indicates the direction of the fourth magnetization of the fourth magnetic layer. In the present embodiment, the direction of the fourth magnetization of the fourth magnetic layer is the −Y direction.

From the viewpoint of the manufacturing accuracy of the MR element 21, the direction of the fourth magnetization may be slightly different from the foregoing direction.

The third magnetic layer may have uniaxial magnetic anisotropy in a direction parallel to the X direction. The uniaxial magnetic anisotropy may be shape magnetic anisotropy. In this case, the direction of the third magnetization of the third magnetic layer changes with a change in the strength of a component of the magnetic field to be detected MF in a direction parallel to the Y direction. The component of the magnetic field to be detected MF in the direction parallel to the Y direction will hereinafter be referred to as a Y-direction component. The strength of the Y-direction component is expressed in positive values if the direction of the Y-direction component is the Y direction. The strength of the Y-direction component is expressed in negative values if the direction of the Y-direction component is the −Y direction. The strength of the Y-direction component depends on the first angle θ1 (see FIG. 8) that the first direction D1 forms with respect to the Z direction. More specifically, assuming the strength of the magnetic field to be detected MF is H1, the strength of the Y-direction component is given by H1·sin θ1. The direction of the third magnetization of the third magnetic layer thus depends on H1·sin θ1.

The potential of the signal output node E2 of the second magnetic detection unit 20 depends on the resistance of the MR element 21. The resistance of the MR element 21 depends on H1·sin θ1. The second magnetic detection unit 20 generates a signal corresponding to the potential of the signal output node E2 as the second detection signal S2. In particular, in the present embodiment, the second detection signal S2 is normalized to sin θ1.

Like the first embodiment, the first detection signal S1 generated by the first magnetic detection unit 10 is normalized as represented by Eq. (5).

Figure 15:
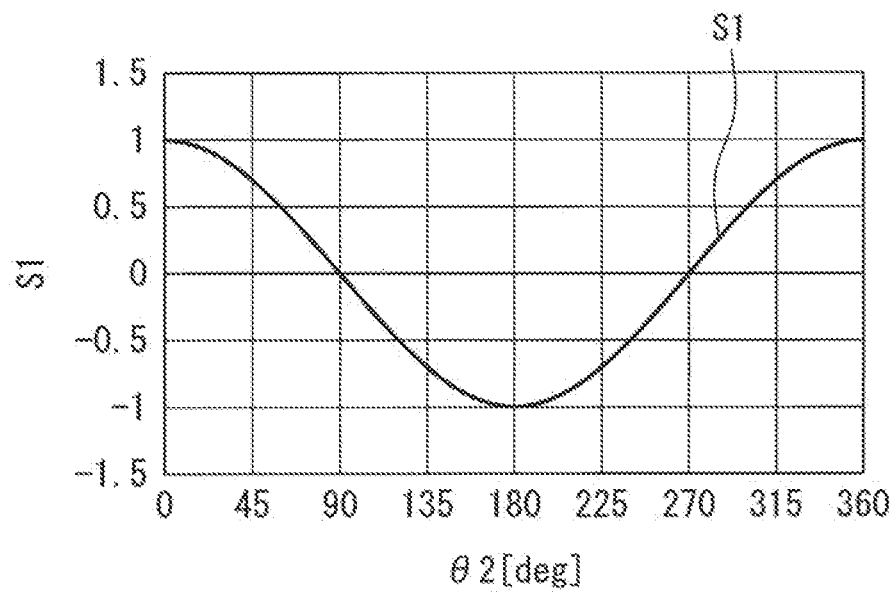
FIG. 15 is a waveform chart showing a relationship between a second angle and a first detection signal in the second embodiment of the invention.
Figure 16:
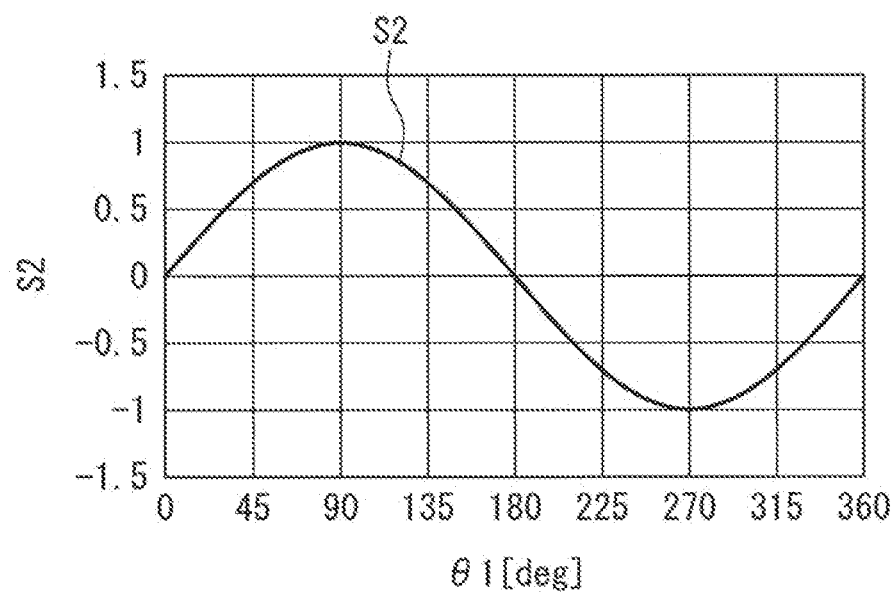
FIG. 16 is a waveform chart showing a relationship between a first angle and a second detection signal in the second embodiment of the invention.

FIG. 15 is a waveform chart showing a relationship between the second angle θ2 and the first detection signal S1. FIG. 16 is a waveform chart showing a relationship between the first angle θ1 and the second detection signal S2. If the first angle θ1 is 0°, the second angle θ2 is also 0°. If the first angle θ1 is 90°, the second angle θ2 is also 90°. If the first angle θ1 is 180°, the second angle θ2 is also 180°. If the first angle θ1 is 270°, the second angle θ2 is also 270°. In terms of both angles θ1 and θ2, 360° is equivalent to 0°.

In the following description, items applicable to both 0° and 360° in terms of the angles θ1 and θ2 will therefore be only described for 0°.

Next, a method for generating the detection value θs of the present embodiment will be described. In the present embodiment, the variable range of the first direction D1 includes a first region R1 and a second region R2 that are different from each other. As described above, the variable range of the first direction D1 is within 360°. The first angle θ1 will hereinafter be assumed to change within the variable range of 0° or greater and not greater than 360°. Here, a range of the first direction D1 where the first angle θ1 is greater than 0° and smaller than 180° will be referred to as the first region R1. A range of the first direction D1 where the first angle θ1 is greater than 180° and smaller than 360° will be referred to as the second region R2. If the first direction D1 is in the first region R1, both the first and second angles θ1 and θ2 fall within the range of greater than 0° and smaller than 180°. If the first direction D1 is in the second region R2, both the first and second angles θ1 and θ2 fall within the range of greater than 180° and smaller than 360°.

As shown in FIG. 15, the first detection signal S1 changes with a change in the second angle θ2. Like the first angle θ1, the second angle θ2 changes within the variable range of 0° or greater and not greater than 360°. There are two values of the second angle θ2 at which the first detection signal S1 has a specific same value, within the variable range of the second angle θ2 except 0° and 180°. Similarly, there are two values of the first angle θ1 at which the first detection signal S1 has the specific same value, within the variable range of the first angle θ1 except 0° and 180°. In other words, there are two candidates for the first direction D1 corresponding to a specific same value of the first detection signal S1, within the variable range of the first angle θ1 except 0° and 180°. One of the two candidates is in the first region R1, and the other thereof is in the second region R2. If the first angle θ1 changes within the variable range of 0° or greater and not greater than 360° and the first angle θ1 is other than 0° or 180°, the first direction D1 is unable to be identified by using only the first detection signal S1.

In the present embodiment, the detection value θs corresponding to the first direction D1 on a one-to-one basis can be generated on the basis of the first and second detection signals S1 and S2. In other words, according to the present embodiment, the first direction D1 can be identified on the basis of the first and second detection signals S1 and S2. A detailed description thereof is given below.

As shown in FIG. 16, the second detection signal S2 has a positive value if the first direction D1 is in the first region R1, i.e., the first angle θ1 is greater than 0° and smaller than 180°. The second detection signal S2 has a negative value if the first direction D1 is in the second region R2, i.e., the first angle θ1 is greater than 180° and smaller than 360°. The second detection signal S2 thus has two different values corresponding to the two candidates for the first direction D1 corresponding to a specific same value of the first detection signal S1. Which of the two candidates for the first direction D1 is the true first direction D1 can therefore be found out by using the second detection signal S2. Specifically, if the second detection signal S2 has a positive value, the candidate for the first direction D1 in the first region R1 is the true first direction D1. If the second detection signal S2 has a negative value, the candidate for the first direction D1 in the second region R2 is the true first direction D1. In such a manner, according to the present embodiment, the first direction D1 can be identified on the basis of the first and second detection signals S1 and S2.

In the present embodiment, the detection value generation unit 30 generates the detection value θs corresponding to the first direction D1 on a one-to-one basis by using the foregoing characteristic. Now, first and second examples of the configuration and processing content of the detection value generation unit 30 will be described. In the first and second examples, as shown in FIG. 14, the detection value generation unit 30 includes a comparator 33 and an angle calculation unit 34. The comparator 33 determines whether the value of the second detection signal S2 is greater than or equal to 0, and outputs the determination result.

In the first example, the angle calculation unit 34 initially calculates the value θ2s representing the second angle θ2 on the basis of the first detection signal S1 by using Eq. (6) in the first embodiment. In the first example, the range of the value θ2s is 0° or greater and not greater than 180°. The angle calculation unit 34 then calculates the detection value θs by using Eq. (7) in the first embodiment, excluding the exceptions to be described later. In the present embodiment, the range of the detection value θs is 0° or greater and smaller than 360°. Like the first embodiment, the foregoing exceptions refer to situations where the value θ2s is 0° or 180°. If the value θ2s is 0° or 180°, the angle calculation unit 34 simply uses the value θ2s as the detection value θs.

In the first example, θs in Eq. (7) has two solutions except the exceptions. One of the two solutions is in the range of greater than 0° and smaller than 180°. The other is in the range of greater than 180° and smaller than 360°. The angle calculation unit 34 then determines which of the two solutions of θs in Eq. (7) is the true value of θs by using the determination result of the comparator 33. Specifically, if the second detection signal S2 has a value of 0 or more, the angle calculation unit 34 selects the solution in the range of greater than 0° and smaller than 180° as θs. If the second detection signal S2 has a negative value, the angle calculation unit 34 selects the solution in the range of greater than 180° and smaller than 360° as θs.

In the second example, the angle calculation unit 34 initially calculates the value θ2s on the basis of the first detection signal S1 by using Eq. (6) in the first embodiment. In the second example, the range of the value θ2s is 0° or greater and smaller than 360°. θ2s in Eq. (6) has two solutions except the exceptions when the value θ2s is other than 0° and 180°. One of the two solutions is in the range of greater than 0° and smaller than 180°. The other is in the range of greater than 180° and smaller than 360°. The angle calculation unit 34 determines which of the two solutions of θ2s in Eq. (6) is the true value of θ2s by using the determination result of the comparator 33. Specifically, if the second detection signal S2 has a value of 0 or more, the angle calculation unit 34 selects the solution in the range of greater than 0° and smaller than 180° as θ2s. If the second detection signal S2 has a negative value, the angle calculation unit 34 selects the solution in the range of greater than 180° and smaller than 360° as θ2s. If the value θ2s is 0° or 180°, the angle calculation unit 34 simply uses the value θ2s as the detection value θs.

Next, the angle calculation unit 34 calculates the detection value θs by using Eq. (7) in the first embodiment. The range of the detection value θs is 0° or greater and smaller than 360°. θs in Eq. (7) has two solutions. One of the two solutions is in the range of greater than 0° and smaller than 180°. The other is in the range of greater than 180° and smaller than 360°. The angle calculation unit 34 selects the closer of the two solutions to the value of θ2s as θs.

The configuration, operation and effects of the present embodiment are otherwise the same as those of the first embodiment.

Third Embodiment

Figure 17:
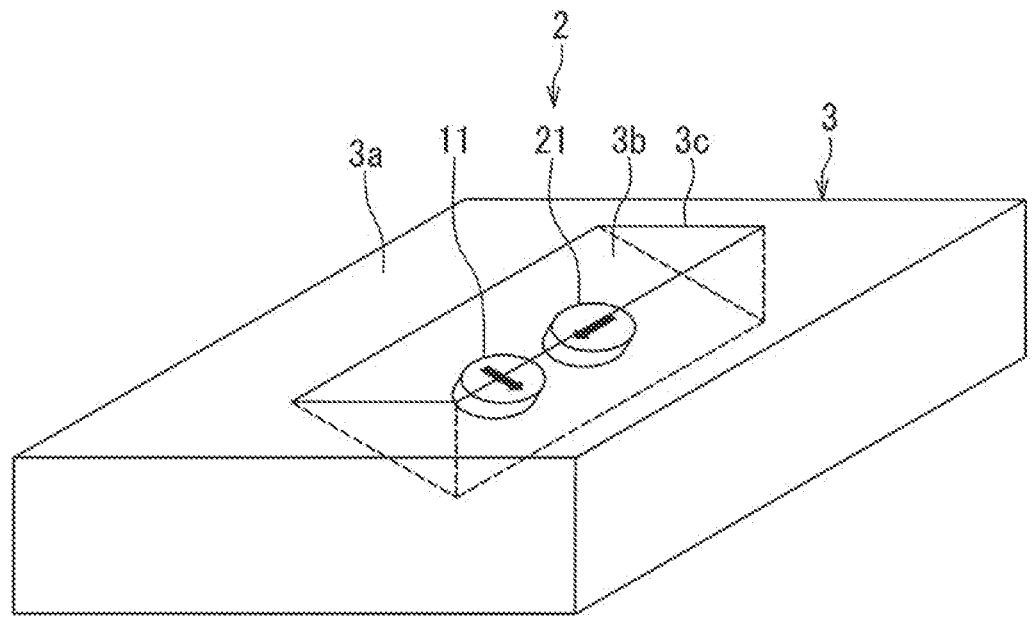
FIG. 17 is a perspective view showing a magnetic sensor according to a third embodiment of the invention.

A third embodiment of the invention will now be described. Initially, differences of a magnetic sensor 2 according to the present embodiment from that according to the second embodiment will be described with reference to FIG. 17. FIG. 17 is a perspective view showing the magnetic sensor 2. As shown in FIG. 17, in the present embodiment, the MR element 21 of the second magnetic detection unit 20 of the magnetic sensor 2 is located on the slope 3b of the substrate 3 like the MR element 11 of the first magnetic detection unit 10 of the magnetic sensor 2.

Like the second embodiment, the MR elements 11 and 21 are located within an area where no substantial difference occurs in the direction of the magnetic field to be detected MF depending on the positions where the MR elements 11 and 21 receive the magnetic field to be detected MF. The directions of the magnetic field to be detected MF received by the MR elements 11 and 21 are thus substantially the same.

In the present embodiment, the third magnetization of the third magnetic layer of the MR element 21 can change in direction within the same plane as the second plane PL2 (see FIGS. 3 and 4) corresponding to the MR element 11 or within a plane parallel to the second plane PL2. The direction of the third magnetization changes with a change in the second direction D2 (see FIGS. 3 and 9) of the in-plane component MFa of the magnetic field to be detected MF received by the MR element 11. The direction of the third magnetization preferably follows the change in the second direction D2 with high accuracy. For that purpose, the third magnetic layer preferably has a characteristic that the third magnetization is saturated by the magnetic field to be detected MF if the first direction D1 of the magnetic field to be detected MF is in at least part of the variable range. The third magnetic layer more preferably has a characteristic that the third magnetization is saturated by the magnetic field to be detected MF regardless of what direction within the variable range the first direction D1 is.

As described in the second embodiment, the MR element 11 is a spin valve MR element. The third magnetic layer preferably has a small uniaxial magnetic anisotropy so that the direction of the third magnetization of the third magnetic layer follows a change in the second direction D2 with high accuracy.

As described in the first embodiment, the second direction D2 changes with a change in the first direction D1 (see FIGS. 3 and 8) of the magnetic field to be detected MF. The resistance of the MR element 21 thus changes with a change in the first direction D1, and as a result, the signal output node E2 (see FIG. 13) of the second magnetic detection unit 20 changes in potential. The second magnetic detection unit 20 generates a signal corresponding to the potential of the signal output node E2 as the second detection signal S2. The second detection signal S2 changes with a change in the first direction D1.

As described in the second embodiment, the direction of the fourth magnetization in the fourth magnetic layer of the MR element 21 is the −Y direction. The direction of the fourth magnetization does not change with a change in the second direction D2 of the in-plane component MFa. The second detection signal S2 can be normalized so that the second detection signal S2 has a value of 0 if the second angle θ2 (see FIG. 9) that the second direction D2 forms with respect to the U direction is 0° or 180°, a value of 1 if the second angle θ2 is 90°, and a value of −1 if the second angle θ2 is 270°. In this case, the second detection signal S2 is represented by the following Eq. (8):

$$S2 = \sin θ2. \quad (8)$$

Next, a method for generating the detection value θs of the present embodiment will be described. As described in the second embodiment, there are two candidates for the first direction D1 corresponding to a specific same value of the first detection signal S1 within the variable range of the first angle θ1 except 0° and 180°. One of the two candidates is in the first region R1, and the other is in the second region R2.

From Eq. (8), the second detection signal S2 has a positive value if the first direction D1 is in the first region R1, i.e., the second angle θ2 is greater than 0° and smaller than 180°. The second detection signal S2 has a negative value if the first direction D1 is in the second region R2, i.e., the second angle θ2 is greater than 180° and smaller than 360°. The second detection signal S2 thus has two different values corresponding to the two candidates for the first direction D1 corresponding to a specific same value of the first detection signal S1. Which of the two candidates for the first direction D1 is the true first direction D1 can therefore be found out by using the second detection signal S2. Specifically, if the second detection signal S2 has a positive value, the candidate for the first direction D1 in the first region R1 is the true first direction D1. If the second detection signal S2 has a negative value, the candidate for the first direction D1 in the second region R2 is the true first direction D1. In this manner, according to the present embodiment, the first direction D1 can be identified on the basis of the first and second detection signals S1 and S2.

In the present embodiment, the detection value generation unit 30 generates the detection value θs corresponding to the first direction D1 on a one-to-one basis by using the foregoing characteristic. First and second examples of the configuration and processing content of the detection value generation unit 30 in the present embodiment will now be described. In the first and second examples, like the second embodiment, the detection value generation unit 30 includes the comparator 33 and the angle calculation unit 34 shown in FIG. 14. However, in the present embodiment, the angle calculation unit 34 calculates the value θ2s on the basis of the first and second detection signals S1 and S2 by using the following Eq. (9) instead of Eq. (6) in the second embodiment:

$$θ2s = a\tan(S2/S1). \quad (9)$$

In other respects, the first and second examples in the present embodiment are the same as those in the second embodiment.

The configuration, operation and effects of the present embodiment are otherwise the same as those of the second embodiment.

Fourth Embodiment

A fourth embodiment of the invention will now be described. A magnetic sensor 2 according to the present embodiment has the same configuration as that according to any one of the first to third embodiments except that the configuration of the first magnetic detection unit 10 is different.

Figure 18:
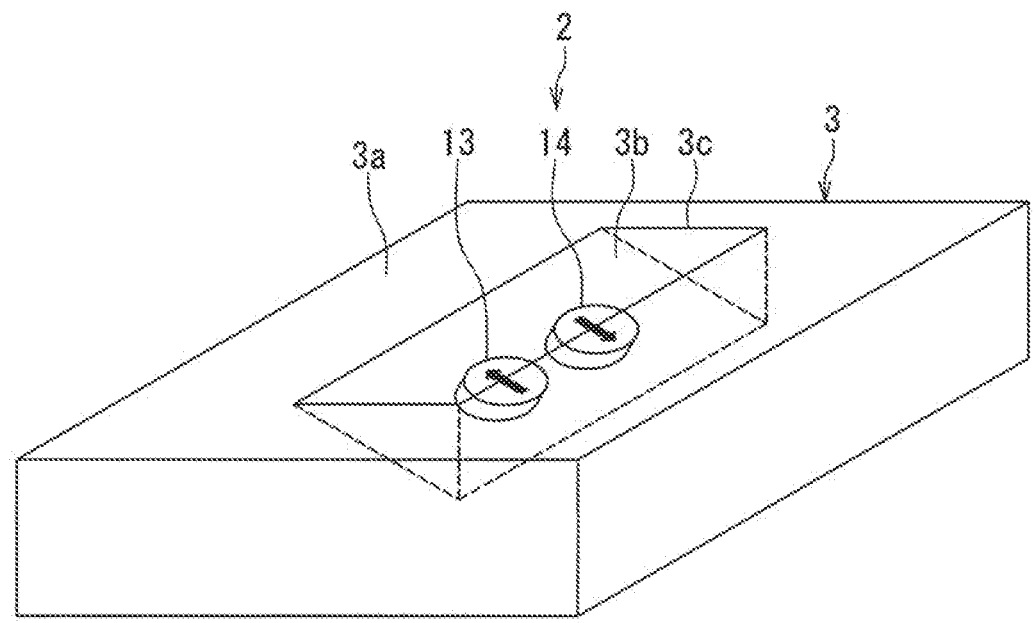
FIG. 18 is a perspective view showing at least part of a magnetic sensor according to a fourth embodiment of the invention.
Figure 19:
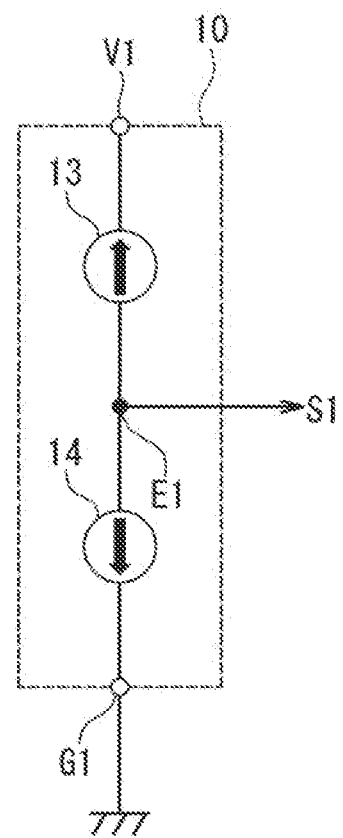
FIG. 19 is a circuit diagram showing a configuration of a first magnetic detection unit of the magnetic sensor according to the fourth embodiment of the invention.

FIG. 18 is a perspective view showing at least a part of the magnetic sensor 2. FIG. 19 is a circuit diagram showing a configuration of the first magnetic detection unit 10 of the magnetic sensor 2. As shown in FIG. 19, in the present embodiment, the first magnetic detection unit 10 of the magnetic sensor 2 includes a first MR element 13 and a second MR element 14 instead of the MR element 11 and the resistor 12 of the first embodiment. Since the first magnetic detection unit 10 is a part of the magnetic sensor 2, the magnetic sensor 2 can be said to include the first and second MR elements 13 and 14.

All the MR elements included in the magnetic sensor 2 are located within an area where no substantial difference occurs in the direction of the magnetic field to be detected MF depending on the positions where all the MR elements receive the magnetic field to be detected MF. The directions of the magnetic field to be detected MF received by all the MR elements are thus substantially the same.

In the present embodiment, the substrate 3 of the magnetic sensor 2 supports the first and second MR elements 13 and 14. As shown in FIG. 18, the first and second MR elements 13 and 14 are located on the slope 3b of the substrate 3. In the present embodiment, the reference position P0 (see FIGS. 3 and 4) may be the position where the first MR element 13 or the second MR element 14 is located, or an intermediate position between the first and second MR elements 13 and 14.

As shown in FIG. 19, the first and second MR elements 13 and 14 are connected in series via the signal output node E1. The first MR element 13 is arranged between the power supply node V1 and the signal output node E1. The second MR element 14 is arranged between the signal output node E1 and the ground node G1.

In the present embodiment, a common second plane PL2 is defined for the first and second MR elements 13 and 14. In the present embodiment, one second plane PL2 therefore serves both as a second plane corresponding to the first MR element 13 and as a second plane corresponding to the second MR element 14. The second plane PL2 of the present embodiment is the same as that corresponding to the MR element 11 of the first embodiment (see FIGS. 3 and 4).

In the present embodiment, the second direction of the in-plane component of the magnetic field to be detected MF received by the first MR element 13 and the second direction of the in-plane component of the magnetic field to be detected MF received by the second element 14 are the same as the second direction D2 of the first embodiment, shown in FIG. 3.

The first and second MR elements 13 and 14 each have the same configuration as that of the MR element 11 of the first embodiment. More specifically, the first and second MR elements 13 and 14 each include a first magnetic layer, a second magnetic layer, and a gap layer. The first magnetic layer has first magnetization that can change in direction within the second plane PL2. The second magnetic layer has second magnetization in a direction parallel to the second plane PL2. The gap layer is located between the first and second magnetic layers. In FIGS. 18 and 19, the thick arrows indicate the directions of the second magnetization in the respective second magnetic layers. In the present embodiment, the direction of the second magnetization in the second magnetic layer of the first MR element 13 is the U direction. The direction of the second magnetization in the second magnetic layer of the second MR element 14 is the −U direction.

In each of the first and second MR elements 13 and 14, the direction of the first magnetization of the first magnetic layer changes with a change in the second direction D2 (see FIGS. 3 and 9) of the in-plane component MFa of the magnetic field to be detected MF. The second direction D2 changes with a change in the first direction D1 (see FIGS. 3 and 8) of the magnetic field to be detected MF. The resistances of the respective first and second MR elements 13 and 14 thus change with a change in the first direction D1. In the present embodiment, as the first direction D1 changes, either one of the resistances of the first and second MR elements 13 and 14 increases and the other decreases. This changes the potential of the signal output node E1. Like the first embodiment, the first magnetic detection unit 10 generates a signal corresponding to the potential of the signal output node E1 as the first detection signal S1. In the present embodiment, the detection value θs depends on the potential of the signal output node E1.

From the viewpoint of the manufacturing accuracy of the MR elements 13 and 14, the direction of the second magnetization may be slightly different from the foregoing direction.

The remainder of configuration, function and effects of the present embodiment are similar to those of any of the first to third embodiments.

Fifth Embodiment

Figure 20:
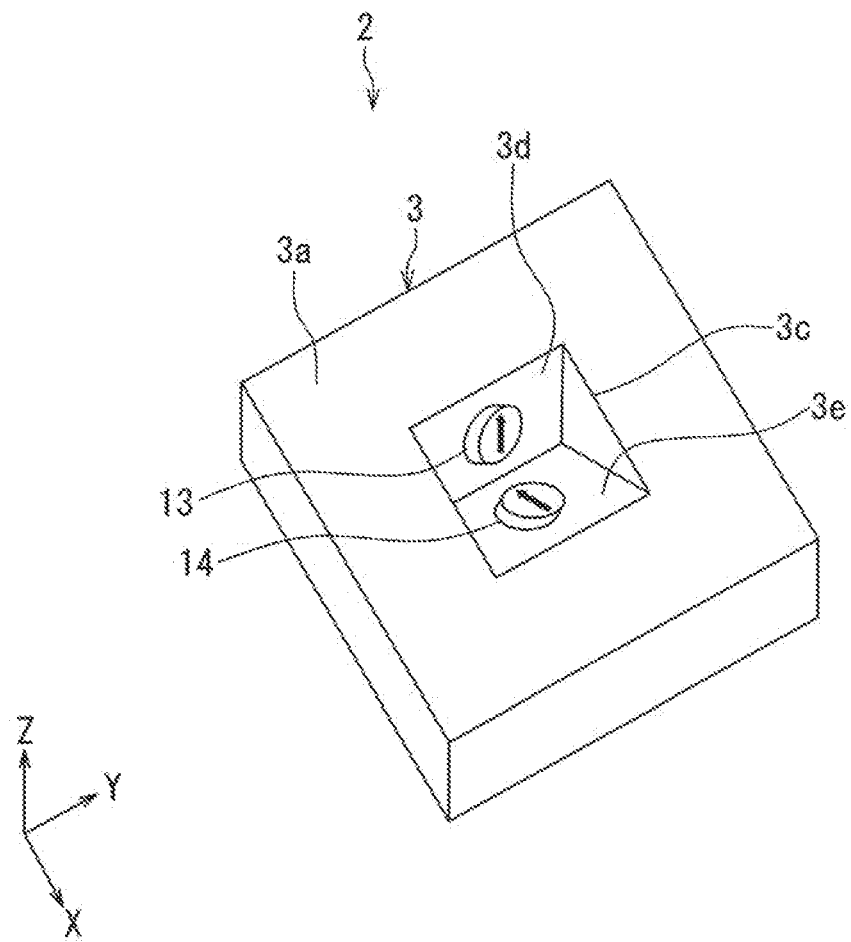
FIG. 20 is a perspective view showing a magnetic sensor according to a fifth embodiment of the invention.
Figure 21:
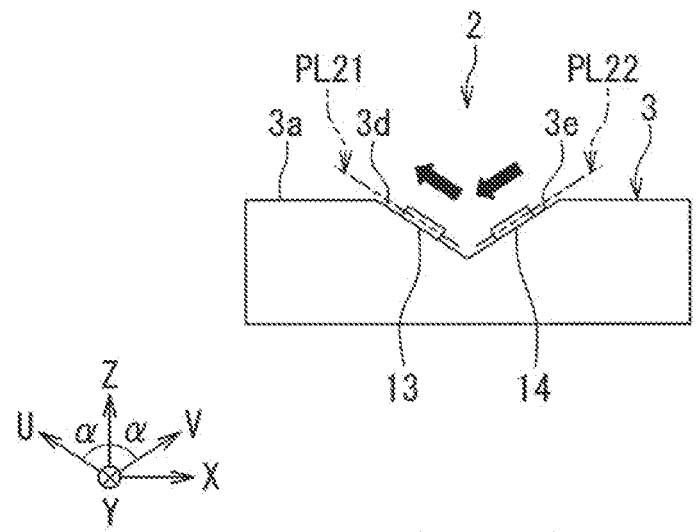
FIG. 21 is a sectional view showing a cross section of the magnetic sensor according to the fifth embodiment of the invention.

A fifth embodiment of the invention will now be described. Initially, differences of a magnetic sensor 2 according to the present embodiment from that according to the fourth embodiment will be described with reference to FIGS. 20 and 21. FIG. 20 is a perspective view showing the magnetic sensor 2. FIG. 21 is a sectional view showing a cross section of the magnetic sensor 2. In the present embodiment, the groove portion 3c in the substrate 3 of the magnetic sensor 2 includes a first slope 3d and a second slope 3e both oblique to the main surface 3a, instead of the slope 3b of the first embodiment. Both the first and second slopes 3d and 3e are flat surfaces. The first and second slopes 3d and 3e are symmetrical about the YZ plane therebetween.

Like the fourth embodiment, all the MR elements included in the magnetic sensor 2 are located within an area where no substantial difference occurs in the direction of the magnetic field to be detected MF depending on the positions where all the MR elements receive the magnetic field to be detected MF. The directions of the magnetic field to be detected MF received by all the MR elements are thus substantially the same.

The first MR element 13 of the first magnetic detection unit 10 of the magnetic sensor 2 is located on the first slope 3d. The second MR element 14 of the first magnetic detection unit 10 of the magnetic sensor 2 is located on the second slope 3e. FIG. 21 shows a cross section of the magnetic sensor 2 parallel to the XZ plane, where the first and second MR elements 13 and 14 intersect.

As shown in FIG. 21, in the present embodiment, different second planes PL21 and PL22 are defined for the first and second MR elements 13 and 14, respectively. The second plane PL21 corresponding to the first MR element 13 is the same as the second plane PL2 (see FIGS. 3 and 4) corresponding to the MR element 11 according to the first embodiment. The second plane PL21 is thus a UY plane that intersects the first plane PL1 at a dihedral angle α.

The second plane PL22 corresponding to the second MR element 14 is symmetrical with the second plane PL21 about the YZ plane. As shown in FIG. 21, a direction rotated from the Z direction toward the X direction by α will be referred to as a V direction. The direction opposite to the V direction will be referred to as a −V direction. The second plane PL22 is a plane that intersects the first plane PL1 at a dihedral angle α and that is parallel to the V direction and the Y direction, i.e., a VY plane.

The first slope 3d is tilted to form a dihedral angle α with respect to the first plane PL1 and is parallel to the UY plane. The second plane PL21 is thus parallel to the first slope 3d.

The second slope 3e is tilted to form a dihedral angle α with respect to the first plane PL1 and is parallel to the VY plane. The second plane PL22 is thus parallel to the second slope 3e.

In the present embodiment, the first magnetic layer of the first MR element 13 has first magnetization that can change in direction within the second plane PL21 corresponding to the first MR element 13. The magnetic field to be detected MF received by the first MR element 13 can be divided into an in-plane component (hereinafter, referred to as a first in-plane component) parallel to the second plane PL21 and a perpendicular component perpendicular to the second plane PL21. The first in-plane component has a second direction that changes with a change in the first direction D1 of the magnetic field to be detected MF. The first magnetization of the first magnetic layer of the first MR element 13 changes in direction with a change in the second direction of the first in-plane component. In the present embodiment, the angle that the second direction of the first in-plane component forms with respect to the U direction will be referred to as a second angle $\theta 2$. The positive and negative signs of the angle that the second direction of the first in-plane component forms with respect to the U direction are defined the same as those of the second angle $\theta 2$ described in the first embodiment.

In the present embodiment, the first magnetic layer of the second MR element 14 has first magnetization that can change in direction within the second plane PL22 corresponding to the second MR element 14. The magnetic field to be detected MF received by the second MR element 14 can be divided into an in-plane component (hereinafter, referred to as a second in-plane component) parallel to the second plane PL22 and a perpendicular component perpendicular to the second plane PL22. The second in-plane component has a second direction that changes with a change in the first direction D1 of the magnetic field to be detected MF. The first magnetization of the first magnetic layer of the second MR element 14 changes in direction with a change in the second direction of the second in-plane component.

The angle that the second direction of the second in-plane component forms with respect to the V direction will be referred to as a third angle. Within the second plane PL22 corresponding to the second MR element 14, the second direction of the second in-plane component rotates about the position where the second MR element 14 is located. The third angle is expressed in positive values when seen in a direction of rotation from the V direction to the Y direction, and expressed in negative values when seen in a direction of rotation from the V direction to the −Y direction. The third angle is equal to the second angle $\theta 2$.

In FIGS. 20 and 21, the thick arrows indicate the directions of the second magnetization in the respective second magnetic layers of the first and second MR elements 13 and 14. The direction of the second magnetization in the second magnetic layer of the first MR element 13 is the U direction. The direction of the second magnetization in the second magnetic layer of the second MR element 14 is the −V direction. In the present embodiment, as the first direction D1 changes, either one of the resistances of the first and second MR elements 13 and 14 increases and the other decreases. This changes the potential of the signal output node E1 (see FIG. 19). The first magnetic detection unit 10 generates a signal corresponding to the potential of the signal output node E1 as the first detection signal S1. In the present embodiment, the detection value θs depends on the potential of the signal output node E1.

From the viewpoint of the manufacturing accuracy of the MR elements 13 and 14, the direction of the second magnetization may be slightly different from the foregoing direction.

The configuration, operation and effects of the present embodiment are otherwise the same as those of the fourth embodiment.

Sixth Embodiment

Figure 22:
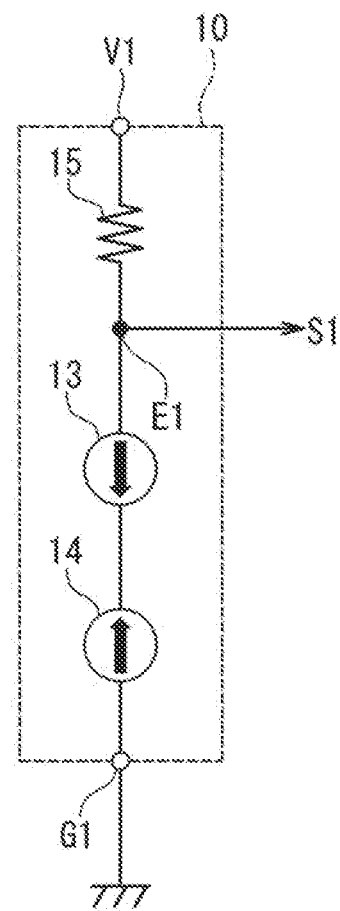
FIG. 22 is a circuit diagram showing a configuration of a first magnetic detection unit of a magnetic sensor according to a sixth embodiment of the invention.

A sixth embodiment of the invention will now be described. Initially, differences of a magnetic sensor 2 according to the present embodiment from that according to the fifth embodiment will be described with reference to FIG. 22. FIG. 22 is a circuit diagram showing a configuration of a first magnetic detection unit 10 of the magnetic sensor 2. As shown in FIG. 22, in the present embodiment, the first magnetic detection unit 10 of the magnetic sensor 2 includes a resistor 15 aside from the first MR element 13, the second MR element 14, the signal output node E1, the power supply node V1, and the ground node G1. The resistor 15, the first MR element 13, and the second MR element 14 are connected in series in this order from the power supply node V1 side. The resistor 15 is arranged between the power supply node V1 and the signal output node E1. The first and second MR elements 13 and 14 are arranged between the signal output node E1 and the ground node G1.

Like the fifth embodiment, all the MR elements included in the magnetic sensor 2 are located within an area where no substantial difference occurs in the direction of the magnetic field to be detected MF depending on the positions where all the MR elements receive the magnetic field to be detected MF. The directions of the magnetic field to be detected MF received by all the MR elements are thus substantially the same.

In FIG. 22, the thick arrows indicate the directions of the second magnetization in the respective second magnetic layers of the first and second MR elements 13 and 14. In the present embodiment, the direction of the second magnetization in the second magnetic layer of the first MR element 13 is the −U direction (see FIG. 21). The direction of the second magnetization in the second magnetic layer of the second MR element 14 is the −V direction (see FIG. 21).

In the present embodiment, the resistances of the respective first and second MR elements 13 and 14 change similarly with a change in the first direction D1 of the magnetic field to be detected MF. As the first direction D1 changes, the combined resistance of the first and second MR elements 13 and 14 therefore changes. This changes the potential of the signal output node E1. The first magnetic detection unit 10 generates a signal dependent on the potential of the signal output node E1 as the first detection signal S1. In the present embodiment, the detection value θs depends on the combined resistance of the first and second MR elements 13 and 14.

From the viewpoint of the manufacturing accuracy of the MR elements 13 and 14, the direction of the second magnetization may be slightly different from the foregoing direction.

Next, characteristic operation and effect of the magnetic sensor 2 according to the present embodiment will be described. The main surface 3a of the substrate 3 is ideally parallel to the reference plane PL3 (XY plane) of the first embodiment, shown in FIGS. 3 and 4. However, the magnetic sensor 2 can be tilted because of installation accuracy of the magnetic sensor 2, and as a result, the main surface 3a of the substrate 3 can be tilted with respect to the reference plane PL3. In this case, the dihedral angle (hereinafter, referred to as a first dihedral angle) that the second plane PL21 (see FIG. 21) corresponding to the first MR element 13 forms with respect to the first plane PL1 (YZ plane) and the dihedral angle (hereinafter, referred to as a second dihedral angle) that the second plane PL22 (see FIG. 21) corresponding to the second MR element 14 forms with respect to the first plane PL1 deviate from their design values.

If the first dihedral angle deviates from its design value, the second direction of the first in-plane component of the magnetic field to be detected MF received by the first MR element 13 deviates from a desired direction. The direction of the first magnetization in the first magnetic layer of the first MR element 13 then deviates from a desired direction, and as a result, the resistance of the first MR element 13 deviates from a desired value.

Similarly, if the second dihedral angle deviates from its design value, the second direction of the second in-plane component of the magnetic field to be detected MF received by the second MR element 14 deviates from a desired direction. The direction of the first magnetization in the first magnetic layer of the second MR element 14 then deviates from a desired direction, and as a result, the resistance of the second MR element 14 deviates from a desired value.

In the present embodiment, when either one of the first and second dihedral angles becomes greater than its design value due to the tilt of the magnetic sensor 2, the other becomes smaller than its design value. Consequently, when either one of the resistances of the first and second MR elements 13 and 14 becomes greater than a desired value due to the tilt of the magnetic sensor 2, the other becomes smaller than a desired value. According to the present embodiment, the combined resistance of the first and second MR elements 13 and 14 does not vary much because of the tilt of the magnetic sensor 2. According to the present embodiment, the detection accuracy can thus be prevented from dropping due to the tilt of the magnetic sensor 2.

The configuration, operation and effects of the present embodiment are otherwise the same as those of the fifth embodiment.

Seventh Embodiment

A seventh embodiment of the invention will now be described. A magnetic sensor system 1 according to the present embodiment differs from that of the second embodiment in the following respects. The magnetic sensor system 1 according to the present embodiment includes a magnetic sensor 102 according to the present embodiment instead of the magnetic sensor 2 according to the second embodiment. A positional relationship between the magnetic sensor 102 and the magnetic field generator 105 is the same as that between the magnetic sensor 2 and the magnetic field generator 105 in the second embodiment, shown in FIG. 12. The magnetic sensor 102 detects the magnetic field to be detected MF generated by the magnetic field generator 105 and generates a detection value θs.

Figure 23:
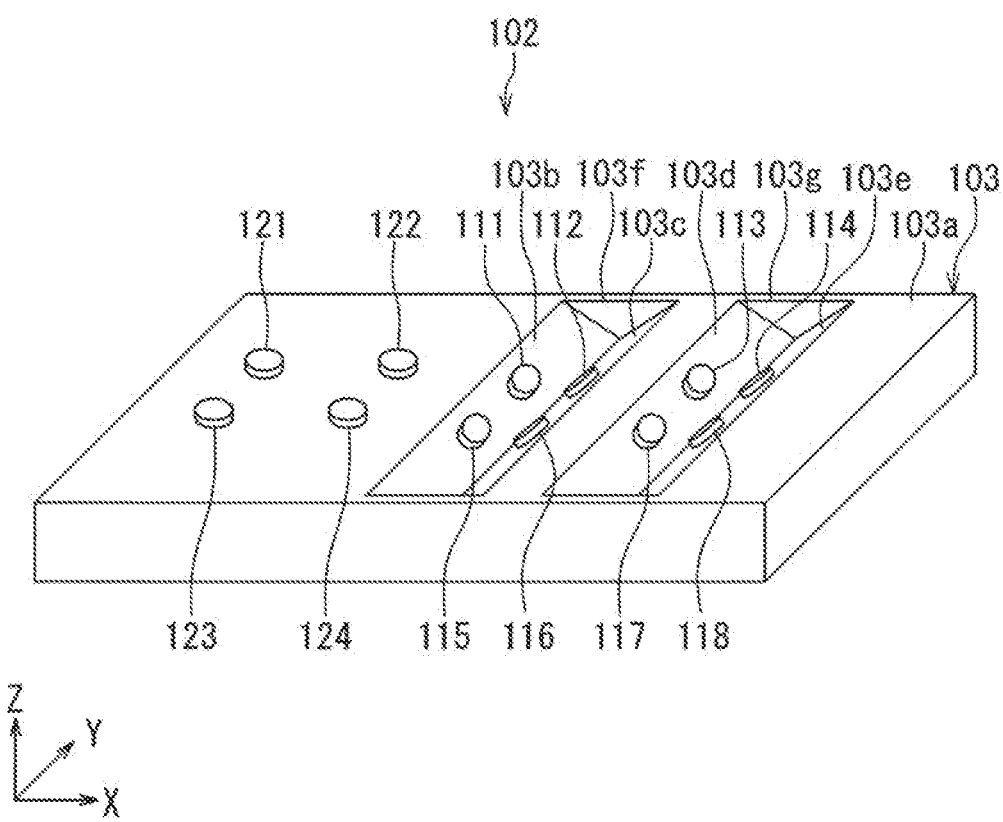
FIG. 23 is a perspective view showing a magnetic sensor according to a seventh embodiment of the invention.
Figure 24:
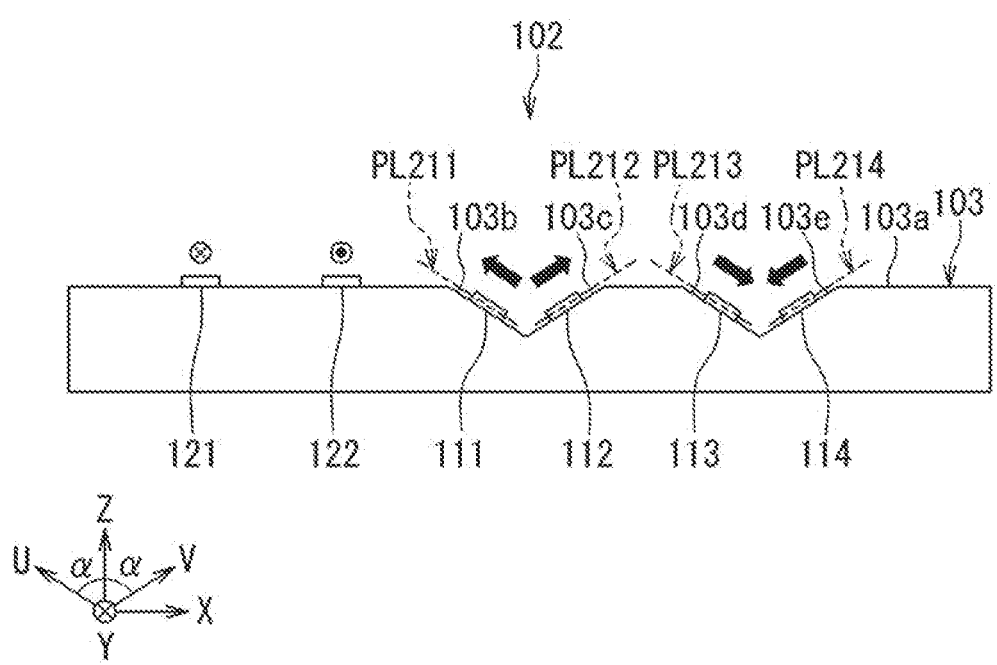
FIG. 24 is a sectional view showing a cross section of the magnetic sensor according to the seventh embodiment of the invention.
Figure 25:
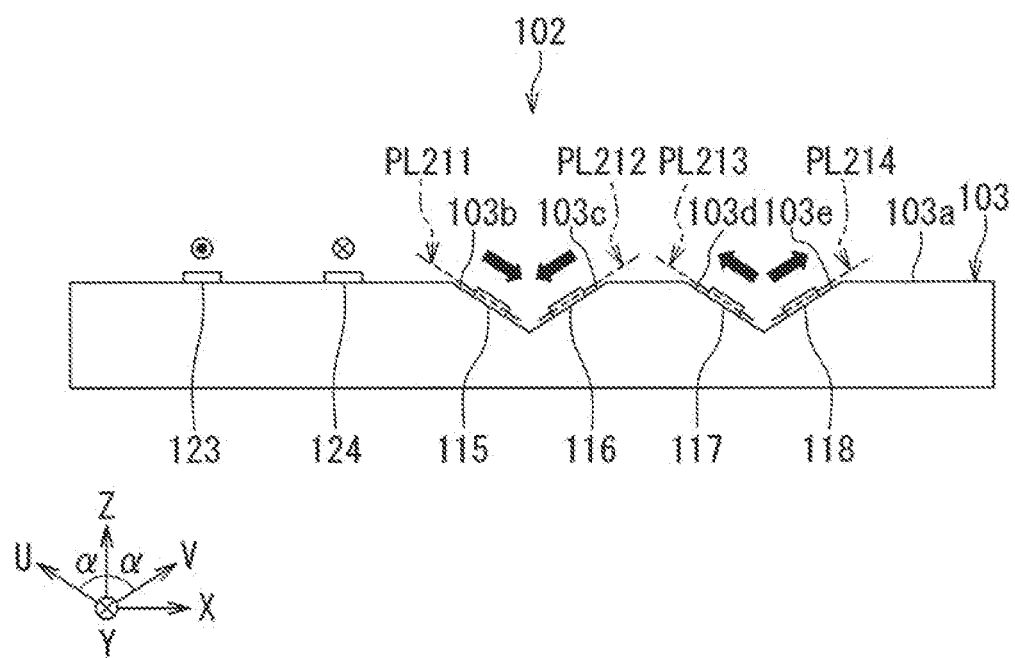
FIG. 25 is a sectional view showing another cross section of the magnetic sensor according to the seventh embodiment of the invention.
Figure 26:
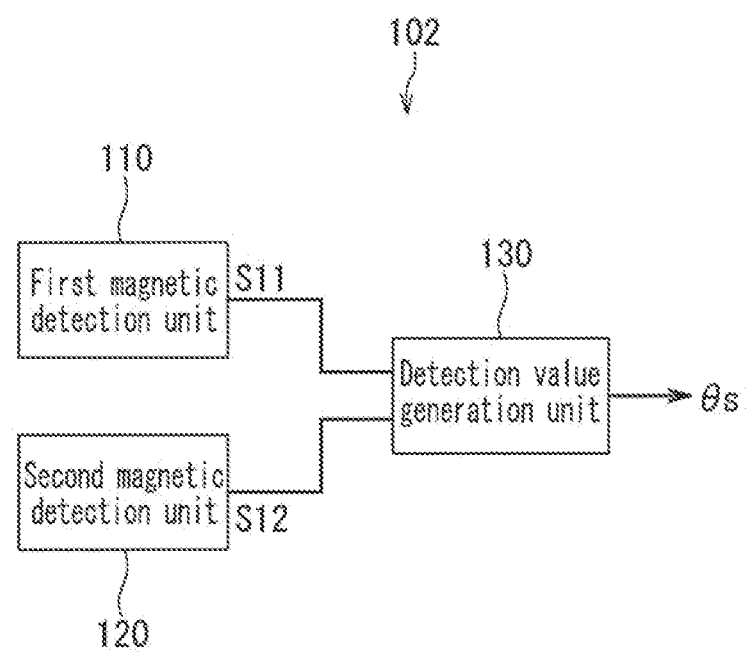
FIG. 26 is a block diagram showing a configuration of the magnetic sensor according to the seventh embodiment of the invention.
Figure 27:
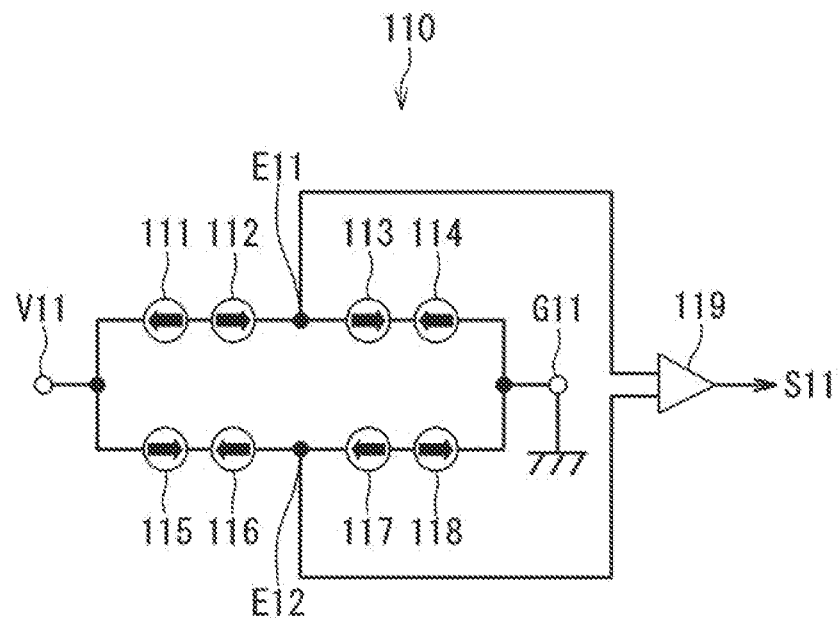
FIG. 27 is a circuit diagram showing a configuration of a first magnetic detection unit of the magnetic sensor according to the seventh embodiment of the invention.
Figure 28:
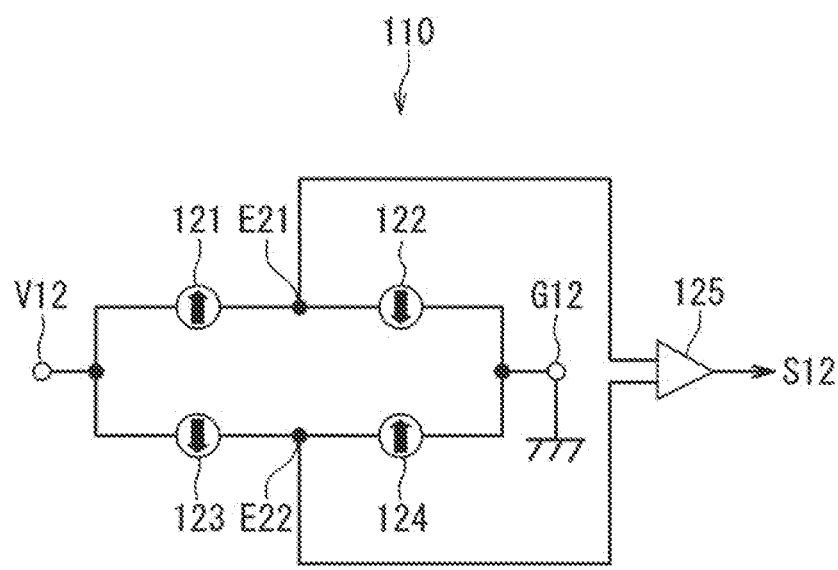
FIG. 28 is a circuit diagram showing a configuration of a second magnetic detection unit of the magnetic sensor according to the seventh embodiment of the invention.

A configuration of the magnetic sensor 102 will be described below with reference to FIGS. 23 to 28. FIG. 23 is a perspective view showing the magnetic sensor 102. FIG. 24 is a sectional view showing a cross section of the magnetic sensor 102. FIG. 25 is a sectional view showing another cross section of the magnetic sensor 102. FIG. 26 is a block diagram showing the configuration of the magnetic sensor 102. FIG. 27 is a circuit diagram showing a configuration of a first magnetic detection unit of the present embodiment. FIG. 28 is a circuit diagram showing a configuration of a second magnetic detection unit of the present embodiment.

As shown in FIG. 26, the magnetic sensor 102 includes a first magnetic detection unit 110, a second magnetic detection unit 120, and a detection value generation unit 130. The first magnetic detection unit 110 generates a first detection signal S11. The second magnetic detection unit 120 generates a second detection signal S12. The detection value generation unit 130 generates the detection value θs on the basis of the first detection signal S11 and the second detection signal S12. The detection value generation unit 130 includes an ASIC or a microcomputer.

As will be described in detail later, the first magnetic detection unit 110 includes eight MR elements. The second magnetic detection unit 120 includes four MR elements. The MR elements are located within an area where no substantial difference occurs in the direction of the magnetic field to be detected MF depending on the positions where the plurality of MR elements receive the magnetic field to be detected MF. The directions of the magnetic field to be detected MF received by the MR elements are therefore substantially the same.

As shown in FIGS. 23 to 25, the magnetic sensor 102 further includes a substrate 103. The substrate 103 includes a main surface 103a perpendicular to the first plane PL1 (YZ plane) of the first embodiment, shown in FIGS. 3 and 4. The substrate 103 also has two groove portions 103f and 103g open in the main surface 103a. The groove portions 103f and 103g are arranged in this order along the X direction. The groove portion 103f includes a first slope 103b and a second slope 103c each oblique to the main surface 103a. The groove portion 103g includes a first slope 103d and a second slope 103e each oblique to the main surface 103a. The first and second slopes 103b and 103c are symmetrical about a YZ plane therebetween. Similarly, the first and second slopes 103d and 103e are symmetrical about a YZ plane therebetween.

As shown in FIG. 27, the first magnetic detection unit 110 includes eight MR elements 111, 112, 113, 114, 115, 116, 117, and 118. The substrate 103 supports the MR elements 111 to 118. In the example shown in FIG. 23, the MR elements 111 to 114 are arranged in a row in this order along the X direction. In the example shown in FIG. 23, the MR elements 115 to 118 are arranged in a row in this order along the X direction, at positions on the −Y direction side of the MR elements 111 to 114. As shown in FIG. 23, the MR elements 111 and 115 are located on the first slope 103b. The MR elements 112 and 116 are located on the second slope 103c. The MR elements 113 and 117 are located on the first slope 103d. The MR elements 114 and 118 are located on the second slope 103e. FIG. 24 shows a cross section of the magnetic sensor 102 parallel to the XZ plane, intersecting the MR elements 111 to 114. FIG. 25 shows a cross section of the magnetic sensor 102 parallel to the XZ plane, intersecting the MR elements 115 to 118. In the present embodiment, the reference position P0 (see FIGS. 3 and 4) is located inside or at the surface of the magnetic sensor 102.

As shown in FIG. 27, the first magnetic detection unit 110 further includes two signal output nodes E11 and E12, a power supply node V11, a ground node G11, and a differential detector 119. The MR elements 111, 112, 113, and 114 are connected in series in this order from the power supply node V11 side. The MR elements 111 and 112 are arranged between the power supply node V11 and the signal output node E11. The MR elements 113 and 114 are arranged between the signal output node E11 and the ground node G11. The MR elements 112 and 113 are connected in series via the signal output node E11.

The MR elements 115, 116, 117, and 118 are connected in series in this order from the power supply node V11 side. The MR elements 115 and 116 are arranged between the power supply node V11 and the signal output node E12. The MR elements 117 and 118 are arranged between the signal output node E12 and the ground node G12. The MR elements 116 and 117 are connected in series via the signal output node E12.

A predetermined magnitude of power supply voltage is applied to the power supply node V11. The ground node G11 is grounded. The differential detector 119 outputs a signal corresponding to a potential difference between the signal output nodes E11 and E12 as the first detection signal S11.

As shown in FIGS. 24 and 25, in the present embodiment, a second plane PL211 common to the MR elements 111 and 115, a second plane PL212 common to the MR elements 112 and 116, a second plane PL213 common to the MR elements 113 and 117, and a second plane PL214 common to the MR elements 114 and 118 are defined. The second plane PL211 is the same as the second plane PL2 (see FIGS. 3 and 4) corresponding to the MR element 11 of the first embodiment. The second plane PL211 is thus a UY plane intersecting the first plane PL1 at a dihedral angle α.

As in the fifth embodiment, a direction rotated from the Z direction toward the X direction by α will be referred to as a V direction. The direction opposite to the V direction will be referred to as a −V direction. The second plane PL212 is symmetrical with the second plane PL211 about the YZ plane. The second plane PL212 is a plane that intersects the first plane PL1 at a dihedral angle α and that is parallel to the V direction and Y direction, i.e., a VY plane.

The second plane PL213 is a UV plane parallel to the second plane PL211. The second plane PL214 is a VY plane parallel to the second plane PL212.

The first slope 103b is tilted to form a dihedral angle α with respect to the first plane PL1 and is parallel to the UY plane. The second plane PL211 is thus parallel to the first slope 103b.

The second slope 103c is tilted to form a dihedral angle α with respect to the first plane PL1 and is parallel to the VY plane. The second plane PL212 is thus parallel to the second slope 103c.

The first slope 103d is tilted to form a dihedral angle α with respect to the first plane PL1 and is parallel to the UY plane. The second plane PL213 is thus parallel to the first slope 103d.

The second slope 103e is tilted to form a dihedral angle α with respect to the first plane PL1 and is parallel to the VY plane. The second plane PL214 is thus parallel to the second slope 103e.

The MR elements 111 to 118 each have the same configuration as that of the MR element 11 of the first embodiment. More specifically, the MR elements 111 to 118 each include a first magnetic layer, a second magnetic layer, and a gap layer.

The magnetic field to be detected MF received by each of the MR elements 111 and 115 can be divided into an in-plane component (hereinafter, referred to as a first in-plane component) parallel to the second plane PL211 and a perpendicular component perpendicular to the second plane PL211.

The first in-plane component has a second direction that changes with a change in the first direction D1 of the magnetic field to be detected MF. The first magnetization of the first magnetic layer of each of the MR elements 111 and 115 changes in direction with a change in the second direction of the first in-plane component. In the present embodiment, the angle that the second direction of the first in-plane component forms with respect to the U direction will be referred to as a second angle θ2. The positive and negative signs of the angle that the second direction of the first in-plane component forms with respect to the U direction are defined the same as those of the second angle θ2 described in the first embodiment.

The magnetic field to be detected MF received by each of the MR elements 112 and 116 can be divided into an in-plane component (hereinafter, referred to as a second in-plane component) parallel to the second plane PL212 and a perpendicular component perpendicular to the second plane PL212. The second in-plane component has a second direction that changes with a change in the first direction D1 of the magnetic field to be detected MF. The first magnetization of the first magnetic layer of each of the MR elements 112 and 116 changes in direction with a change in the second direction of the second in-plane component.

The angle that the second direction of the second in-plane component forms with respect to the V direction will be referred to as a third angle. Within the second plane PL212, the second direction of the second in-plane component rotates about the position where each of the MR elements 112 and 116 is located. The third angle is expressed in positive values when seen in a direction of rotation from the V direction to the Y direction, and expressed in negative values when seen in a direction of rotation from the V direction to the −Y direction. The third angle is equal to the second angle θ2.

The magnetic field to be detected MF received by each of the MR elements 113 and 117 can be divided into an in-plane component (hereinafter, referred to as a third in-plane component) parallel to the second plane PL213 and a perpendicular component perpendicular to the second plane PL213. The third in-plane component has a second direction that changes with a change in the first direction D1 of the magnetic field to be detected MF. The first magnetization of the first magnetic layer of each of the MR elements 113 and 117 changes in direction with a change in the second direction of the third in-plane component.

The angle that the second direction of the third in-plane component forms with respect to the U direction will be referred to as a fourth angle. Within the second plane PL213, the second direction of the third in-plane component rotates about the position where each of the MR elements 113 and 117 is located. The fourth angle is expressed in positive values when seen in a direction of rotation from the U direction to the Y direction, and expressed in negative values when seen in a direction of rotation from the U direction to the −Y direction. The fourth angle is equal to the second angle θ2.

The magnetic field to be detected MF received by each of the MR elements 114 and 118 can be divided into an in-plane component (hereinafter, referred to as a fourth in-plane component) parallel to the second plane PL214 and a perpendicular component perpendicular to the second plane PL214. The fourth in-plane component has a second direction that changes with a change in the first direction D1 of the magnetic field to be detected MF. The first magnetization of the first magnetic layer of each of the MR elements 114 and 118 changes in direction with a change in the second direction of the fourth in-plane component.

The angle that the second direction of the fourth in-plane component forms with respect to the V direction will be referred to as a fifth angle. Within the second plane PL214, the second direction of the fourth in-plane component rotates about the position where each of the MR elements 114 and 118 is located. The fifth angle is expressed in positive values when seen in a direction of rotation from the V direction to the Y direction, and expressed in negative values when seen in a direction of rotation from the V direction to the −Y direction. The fifth angle is equal to the second angle θ2.

The MR elements 111 to 118 each further include a second magnetic layer having second magnetization in a direction parallel to the respective corresponding second plane, and a gap layer located between the first magnetic layer and the second magnetic layer. In FIGS. 24, 25, and 27, the thick arrows indicate the directions of the second magnetization in the second magnetic layers. In the present embodiment, the direction of the second magnetization in the second magnetic layer of each of the MR elements 111 and 117 is the U direction. The direction of the second magnetization in the second magnetic layer of each of the MR elements 112 and 118 is the V direction. The direction of the second magnetization in the second magnetic layer of each of the MR elements 113 and 115 is the −U direction. The direction of the second magnetization in the second magnetic layer of each of the MR elements 114 and 116 is the −V direction.

In each of the MR elements 111 to 118, the direction of the first magnetization of the first magnetic layer changes with a change in the first direction D1 of the magnetic field to be detected MF. The resistance of each of the MR elements 111 to 118 therefore changes with a change in the first direction D1. As a result, the first detection signal S11 changes with a change in the first direction D1.

From the viewpoint of the manufacturing accuracy of the MR elements 111 to 118, the direction of the second magnetization may be slightly different from the foregoing direction.

As described above, the third to fifth angles are all equal to the second angle θ2. The first detection signal S11 can be normalized so that the first detection signal S11 has a value of 1 if the second angle θ2 is 0°, a value of −1 if the second angle θ2 is 180°, and a value of 0 if the second angle θ2 is 90° or 270°. In this case, the first detection signal S11 is represented by the following Eq. (10).

$$S11 = \cos θ2. \quad (10)$$

As shown in FIG. 28, the second magnetic detection unit 120 includes four MR elements 121, 122, 123, and 124. As shown in FIG. 23, the MR elements 121 to 124 are located on the main surface 103a. In the example shown in FIG. 23, the MR elements 121 and 122 are arranged in this order along the X direction, at positions on the −X direction side of the MR element 111. In the example shown in FIG. 23, the MR elements 123 and 124 are arranged in this order along the X direction, at positions on the −Y direction side of the MR elements 121 and 122 and on the −X direction side of the MR element 115.

As shown in FIG. 28, the second magnetic detection unit 120 further includes two signal output nodes E21 and E22, a power supply node V12, a ground node G12, and a differential detector 125. The MR element 121 is arranged between the power supply node V12 and the signal output node E21. The MR element 122 is arranged between the signal output node E21 and the ground node G12. The MR elements 121 and 122 are connected in series via the signal output node E21.

The MR element 123 is arranged between the power supply node V12 and the signal output node E22. The MR element 124 is arranged between the signal output node E22 and the ground node G12. The MR elements 123 and 124 are connected in series via the signal output node E22. A predetermined magnitude of power supply voltage is applied to the power supply node V12. The ground node G12 is grounded. The differential detector 125 outputs a signal corresponding to a potential difference between the signal output nodes E21 and E22 as the second detection signal S12.

The MR elements 121 to 124 each have the same configuration as that of the MR element 21 of the second embodiment. More specifically, the MR elements 121 to 124 each include a third magnetic layer, a fourth magnetic layer, and a gap layer. The third magnetic layer has third magnetization that can change in direction within a virtual plane parallel to the reference plane PL3 (XY plane). The fourth magnetic layer has fourth magnetization in a direction parallel to the virtual plane. The gap layer is located between the third and fourth magnetic layers. The symbols near the MR elements 121 to 124 in FIGS. 24 and 25 and the thick arrows in FIG. 28 indicate the directions of the fourth magnetization in the respective fourth magnetic layers. In the present embodiment, the directions of the fourth magnetization in the fourth magnetic layers of the MR elements 121 and 124 are the Y direction. The directions of the fourth magnetization in the fourth magnetic layers of the MR elements 122 and 123 are the −Y direction.

From the viewpoint of the manufacturing accuracy of the MR elements 121 to 124, the direction of the fourth magnetization may be slightly different from the foregoing direction.

Like the MR element 21 of the second embodiment, the third magnetic layers of the MR elements 121 to 124 may have uniaxial magnetic anisotropy in a direction parallel to the X direction. In this case, the directions of the third magnetization of the third magnetic layers change with the strength of the Y-direction component of the magnetic field to be detected MF, i.e., $H1 \cdot \sin \theta 1$. The resistances of the respective MR elements 121 to 124 thus change with a change in $H1 \cdot \sin \theta 1$. As a result, the second detection signal S12 changes with a change in $H1 \cdot \sin \theta 1$. In particular, in the present embodiment, the second detection signal S12 is normalized to $\sin \theta 1$.

A method for generating the detection value $\theta s$ of the present embodiment is the same as that of the second embodiment except that the first and second detection signals S1 and S2 are replaced with the first and second detection signal S11 and S12. The configuration and function of the detection value generation unit 130 are the same as those of the detection value generation unit 30 of the second embodiment except that the first and second detection signals S1 and S2 of the second embodiment are replaced with the first and second detection signals S11 and S12.

Next, characteristic operation and effect of the magnetic sensor 102 according to the present embodiment will be described. The main surface 103a of the substrate 103 is ideally parallel to the reference plane PL3 (XY plane) of the first embodiment, shown in FIGS. 3 and 4. However, the magnetic sensor 102 can be tilted because of installation accuracy of the magnetic sensor 102, and as a result, the main surface 103a of the substrate 103 can be tilted with respect to the reference plane PL3. In this case, the dihedral angle α that each of the second planes PL211, PL212, PL213, and PL214 forms with respect to the first plane PL1 (YZ plane) deviates from its design values.

In the present embodiment, like the MR elements 13 and 14 of the sixth embodiment, when either one of the resistances of the MR elements 111 and 112 becomes greater than a desired value due to the tilt of the magnetic sensor 102, the other becomes smaller than a desired value. According to the present embodiment, the combined resistance of the MR elements 111 and 112 does not vary much because of the tilt of the magnetic sensor 102.

The foregoing description of the pair of MR elements 111 and 112 also applies to the pair of MR elements 113 and 114, the pair of MR elements 115 and 116, and the pair of MR elements 117 and 118. According to the present embodiment, the detection accuracy of the first magnetic detection unit 110 can be prevented from dropping due to the tilt of the magnetic sensor 102.

The other configuration, function and effects of the present embodiment are the same as those of the second or sixth embodiment.

The present invention is not limited to the foregoing embodiments, and various modifications may be made thereto. For example, the magnetic sensor 102 according to the seventh embodiment may include the second magnetic detection unit 20 of the second or third embodiment instead of the second magnetic detection unit 120.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor configured to detect a magnetic field to be detected and generate a detection value, wherein:
   the magnetic field to be detected has a first direction at a reference position within a first plane, the first direction changing within a predetermined variable range in the first plane;
   the magnetic sensor includes:
      a substrate including a main surface and at least one slope oblique to the main surface; and
      at least one magnetoresistive element located on the at least one slope;
   the at least one magnetoresistive element each includes a first magnetic layer having first magnetization that can change in direction within a corresponding second plane;
   the second plane is oblique to each of the first plane and the main surface;
   the magnetic field to be detected received by each of the at least one magnetoresistive element includes an in-plane component parallel to the second plane;
   the in-plane component has a second direction that changes with a change in the first direction;
   the first magnetic layer is configured such that the direction of the first magnetization changes with a change in the second direction; and
   the detection value depends on the direction of the first magnetization.

2. The magnetic sensor according to claim 1, wherein the first magnetic layer has a characteristic that the first magnetization is saturated by the magnetic field to be detected if the first direction is in at least a part of the predetermined variable range.

3. The magnetic sensor according to claim 1, wherein the at least one magnetoresistive element each further includes a second magnetic layer having second magnetization in a direction parallel to the second plane, and a gap layer located between the first magnetic layer and the second magnetic layer.

4. The magnetic sensor according to claim 1, wherein a dihedral angle formed by the first plane and the second plane is in a range of 30° to 84°.

5. The magnetic sensor according to claim 1, wherein the second plane corresponding to each of the at least one magnetoresistive element is parallel to the at least one slope on which each of the at least one magnetoresistive element is located.

6. The magnetic sensor according to claim 1, further comprising another magnetoresistive element including a third magnetic layer having third magnetization that can change in direction in a plane intersecting each of the first plane and the second plane, wherein:
the third magnetic layer is configured such that a direction of the third magnetization changes with the first direction of the magnetic field to be detected.

7. The magnetic sensor according to claim 6, wherein the third magnetic layer is configured such that the direction of the third magnetization changes with an angle that the first direction of the magnetic field to be detected forms with respect to a predetermined reference direction.

8. The magnetic sensor according to claim 6, wherein the another magnetoresistive element is located on the main surface.

9. The magnetic sensor according to claim 6, wherein the other magnetoresistive element is located on the at least one slope.

10. The magnetic sensor according to claim 1, wherein:
the at least one magnetoresistive element includes a first magnetoresistive element and a second magnetoresistive element; and
the at least one slope includes one slope on which the first and second magnetoresistive elements are located.

11. The magnetic sensor according to claim 1, wherein:
the at least one magnetoresistive element includes a first magnetoresistive element and a second magnetoresistive element; and
the at least one slope includes a first slope on which the first magnetoresistive element is located and a second slope on which the second magnetoresistive element is located.

12. The magnetic sensor according to claim 1, further comprising:
a first magnetic detection unit that includes the at least one magnetoresistive element and configured to generate a first detection signal dependent on the direction of the first magnetization;
a second magnetic detection unit configured to detect the magnetic field to be detected and generate a second detection signal dependent on the first direction; and
a detection value generation unit configured to generate the detection value on a basis of the first detection signal and the second detection signal, wherein:
the predetermined variable range includes a first region and a second region that are different from each other;
two candidates for the first direction corresponding to a specific same value of the first detection signal fall within the respective first and second regions; and
two values of the second detection signal corresponding to the two candidates are different from each other.

* * * * *